United States Patent
Kojima et al.

(10) Patent No.: US 9,056,956 B2
(45) Date of Patent: Jun. 16, 2015

(54) POLYETHYLENE TEREPHTHALATE COMPOSITION, MANUFACTURING METHOD THEREFOR, AND POLYETHYLENE TEREPHTHALATE FILM

(75) Inventors: Hiroji Kojima, Mishima (JP); Jun Sakamoto, Otsu (JP); Koichi Dan, Otsu (JP); Shigeru Aoyama, Otsu (JP)

(73) Assignee: Toray Industries, Inc. (JP)

( * ) Notice: Subject to any disclaimer, the term of this patent is extended or adjusted under 35 U.S.C. 154(b) by 482 days.

(21) Appl. No.: 13/503,406

(22) PCT Filed: Aug. 31, 2010

(86) PCT No.: PCT/JP2010/064781
§ 371 (c)(1),
(2), (4) Date: Apr. 23, 2012

(87) PCT Pub. No.: WO2011/052290
PCT Pub. Date: May 5, 2011

(65) Prior Publication Data
US 2012/0208943 A1     Aug. 16, 2012

(30) Foreign Application Priority Data

Oct. 27, 2009 (JP) .................................. 2009-246427

(51) Int. Cl.
*C08J 5/18* (2006.01)
*C08G 63/20* (2006.01)
(Continued)

(52) U.S. Cl.
CPC . *C08J 5/18* (2013.01); *C08G 63/20* (2013.01); *C08G 63/6926* (2013.01); *C08J 2367/02* (2013.01); *Y02E 10/50* (2013.01); *H01L 31/049* (2014.12)

(58) Field of Classification Search
CPC ....... C08G 63/20; C08G 63/6926; C08J 5/18; C08J 2367/02; Y02E 10/50
USPC .......... 528/272, 279, 286; 502/102, 103, 121; 524/414, 417; 264/291
See application file for complete search history.

(56) References Cited

U.S. PATENT DOCUMENTS 4,161,579 A * 7/1979 Edelman et al. ............... 525/444

FOREIGN PATENT DOCUMENTS

| JP | 9-227767 A | 9/1997 |
| JP | 10-176102 A | 6/1998 |
| JP | 11-246657 A | 9/1999 |

(Continued)

OTHER PUBLICATIONS

Machine translation of JP 2008-007750.*

(Continued)

*Primary Examiner* — Frances Tischler
(74) *Attorney, Agent, or Firm* — DLA Piper LLP (US)

(57) ABSTRACT

A polyethylene terephthalate composition includes a copolymer component having at least 3 functional groups in an amount of 0.01 mol % to 1.00 mol % with respect to ethylene terephthalate units, in which a ratio (Mw/Mn) between the weight average molecular weight and number average molecular weight of the polyethylene terephthalate composition is 5.0 to 8.0; an alkali metal compound in an amount of 1.0 mol/ton to 3.0 mol/ton in terms of alkali metal element; a phosphorus compound in an amount of 1.5 mol/ton to 5.0 mol/ton in terms of elemental phosphorus; and an o-chlorophenol insoluble matter in an amount of less than 0.5 wt %.

20 Claims, 1 Drawing Sheet

(51) Int. Cl.
*C08G 63/692* (2006.01)
*H01L 31/049* (2014.01)

(56) References Cited

FOREIGN PATENT DOCUMENTS

| JP | 2002-332333 A | 11/2002 |
| JP | 2006-210557 A | 8/2006 |
| JP | 2007-277548 A | 10/2007 |
| JP | 2008-007750 A | 1/2008 |
| JP | 2008-031439 A | 2/2008 |
| JP | 2009-170772 A | 7/2009 |
| JP | 2009-184140 A | 8/2009 |

OTHER PUBLICATIONS

Machine translation of JP 11-246657.*

* cited by examiner

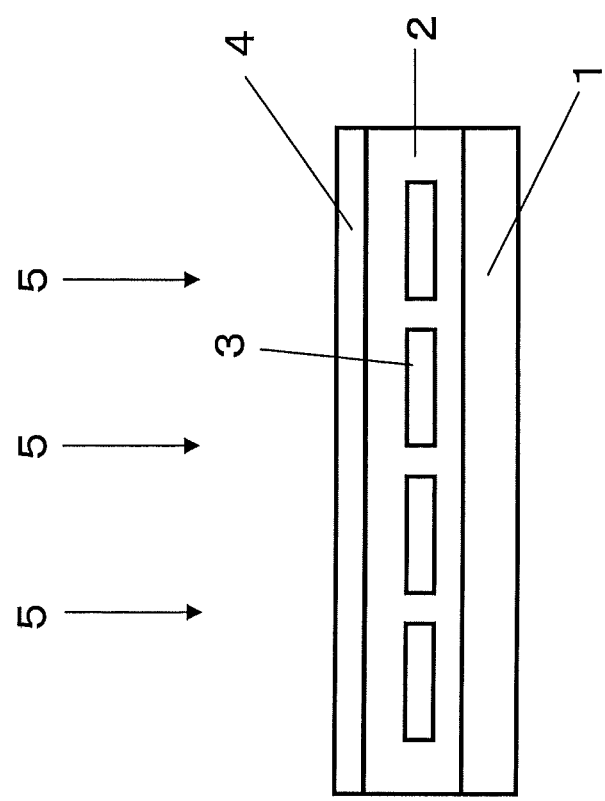

POLYETHYLENE TEREPHTHALATE COMPOSITION, MANUFACTURING METHOD THEREFOR, AND POLYETHYLENE TEREPHTHALATE FILM

RELATED APPLICATIONS

This is a §371 of International Application No. PCT/JP2010/064781, with an international filing date of Aug. 31, 2010 (WO 2011/052290 A1, published May 5, 2011), which is based on Japanese Patent Application No. 2009-246427, filed Oct. 27, 2009, the subject matter of which is incorporated by reference.

TECHNICAL FIELD

This disclosure relates to a polyethylene terephthalate composition which has excellent hydrolysis resistance and retention of elongation and is suitable for use in solar cells; a method of producing the same; and a polyethylene terephthalate film composed of the same.

BACKGROUND

Polyethylene terephthalates have been used in a variety of applications since it has excellent mechanical properties, thermal properties, chemical resistance, electrical properties and moldability.

However, since the mechanical and physical properties of polyethylene terephthalates are impaired by hydrolysis, a variety of studies have been conducted to inhibit such hydrolysis in cases where a polyethylene terephthalate is used over a long period of time or in a humid condition. Particularly, in solar cell films, since their outdoor service life is required to be at least 20 years, high hydrolysis resistance and elongation retention rate are required.

For example, JP 2008-31439 A discloses a technology for reducing the amount of COOH terminal groups and improving hydrolysis resistance by compounding a cross-linked component having at least 3 functional groups and a sequestering agent using a twin-screw extruder.

Further, JP 2007-277548 A discloses a method of producing a polyester containing inorganic phosphate and in the examples thereof, phosphoric acid is used in combination.

JP 2008-7750 A discloses a polyethylene terephthalate containing a buffer phosphorus compound and in the examples thereof, the polyethylene terephthalate is used in combination with a phosphorus compound.

However, although the technology of JP '439 is excellent in improving the initial hydrolysis resistance, since the technology uses no phosphorus compound, hydrolysis reaction proceeds acceleratingly, so that it is difficult to satisfy long-term hydrolysis resistance. In addition, since a cross-linked component is compounded, reaction occurs ununiformly and minute gel-form foreign substances are likely to be generated, so that the technology of JP '439 is not suitable for film applications.

Further, in the technology of JP '548, since the ratio of phosphoric acid and inorganic phosphate and the applied amounts thereof are inappropriate, inorganic phosphate is likely to be converted into a foreign substance and, although the short-term hydrolysis resistance is excellent, long-term hydrolysis resistance, which is required for use in solar cells and the like, is not sufficient, so that the mechanical and physical properties of the film are deteriorated by such foreign substance.

In the technology of JP '750, since the type, ratio, applied amount and the like of the phosphorus compound are not sufficiently and properly adjusted, the resulting hydrolysis resistance and mechanical properties are not sufficient for solar cell applications.

It could therefore be helpful to provide: a polyethylene terephthalate composition overcoming the above-described drawbacks, which has excellent hydrolysis resistance and retention of elongation and is suitable for use in a solar cell film; and a polyethylene terephthalate film composed of this composition.

SUMMARY

We thus provide a polyethylene terephthalate composition comprising a copolymer component having at least 3 functional groups in an amount of 0.01 mol % to 1.00 mol % with respect to ethylene terephthalate units, in which the ratio (Mw/Mn) between the weight average molecular weight and number average molecular weight of the polyethylene terephthalate composition is 5.0 to 8.0, the polyethylene terephthalate composition also comprising: an alkali metal compound in an amount of 1.0 mol/ton to 3.0 mol/ton in terms of alkali metal element; a phosphorus compound in an amount of 1.5 mol/ton to 5.0 mol/ton in terms of elemental phosphorus; and an o-chlorophenol (hereinafter, referred to as "OCP") insoluble matter in an amount of less than 0.50 wt %.

Further, we also provide a method of producing a polyethylene terephthalate composition, which comprises, when producing a polyethylene terephthalate composition using a terephthalic acid component, ethylene glycol and copolymer component having at least 3 functional groups through an esterification reaction or transesterification reaction, adding an ethylene glycol solution or slurry of a phosphoric acid whose pH is adjusted to 2.0 to 6.0 and an alkali metal phosphate at a time between substantial completion of the esterification reaction or transesterification reaction and the start of polycondensation reaction.

Still further, we provide a polyethylene terephthalate film which comprises at least one polyethylene terephthalate film layer composed of the above-described polyethylene terephthalate composition.

Yet still further, we provide a method of producing the above-described polyethylene terephthalate film, which comprises biaxially stretching an unstretched film and then subjecting the thus stretched film to a heat treatment in a temperature range which satisfies the following Equation (1):

$$35° C. \leq Tm-Th \leq 90° C. \quad (1)$$

wherein, Tm: melting point (° C.) of the polyethylene terephthalate composition; and Th: heat treatment temperature (° C.).

We further provide a solar cell backsheet composed of the above-described polyethylene terephthalate film.

It is preferred in the polyethylene terephthalate composition that the amount of COOH terminal groups be not greater than 15 eq/ton and that the cyclic trimer content be not higher than 0.50 wt %.

When the polyethylene terephthalate composition is treated in water vapor at 155° C. for 4 hours, it is preferred that the increase in the amount of COOH terminal groups (ΔCOOH) be not greater than 40 eq/ton.

It is preferred in the polyethylene terephthalate composition that the molar ratio of alkaline earth metal element and elemental phosphorus be 0.5 to 1.5.

It is preferred in the polyethylene terephthalate composition that the phosphorus compound be phosphoric acid and an alkali metal phosphate.

In the method of producing a polyethylene terephthalate composition, when producing a polyethylene terephthalate composition using terephthalic acid, ethylene glycol and a copolymer component having at least 3 functional groups through an esterification reaction thereof, it is preferred that the ethylene glycol be added in an amount of 0.3 times by mole to 0.5 times by mole with respect to the total acid components in the period between substantial completion of the esterification reaction and the start of polycondensation reaction.

It is preferred that the polyethylene terephthalate film comprise at least one polyethylene terephthalate film layer composed of the above-described polyethylene terephthalate composition.

It is preferred that the polyethylene terephthalate film layer have a planar orientation coefficient of not lower than 0.150.

It is preferred in the polyethylene terephthalate film that the amount of COOH terminal groups in the above-described polyethylene terephthalate film layer be not greater than 20 eq/ton.

It is preferred that the above-described polyethylene terephthalate film layer have an intrinsic viscosity (IV) of not lower than 0.65.

It is preferred in the polyethylene terephthalate film that the retention of elongation after a 72 hour treatment at 125° C. and 100% RH be not less than 70%.

Accordingly, a polyethylene terephthalate composition having excellent long-term hydrolysis resistance can be provided. Further, by making the composition into a biaxially stretched film, a film which can be used in those applications of magnetic materials, electric materials such as condensers, packagings and the like and in particular, solar cell film applications where long-term hydrolysis resistance and excellent retention of elongation are required, can be provided.

BRIEF DESCRIPTION OF THE DRAWING

FIG. 1 is a schematic cross-sectional view of one example showing the constitution of a solar cell in which a polyethylene terephthalate film composed of the polyethylene terephthalate composition is used.

DESCRIPTION OF SYMBOLS

1: Backsheet
2: Filler
3: Power generation device
4: Transparent base material
5: Sunlight

DETAILED DESCRIPTION

The polyethylene terephthalate composition is a polyethylene terephthalate composition comprising a copolymer component having at least 3 functional groups in an amount of 0.01 mol % to 1.00 mol % with respect to ethylene terephthalate units, in which the ratio (Mw/Mn) between the weight average molecular weight and number average molecular weight of the polyethylene terephthalate composition is 5.0 to 8.0, the polyethylene terephthalate composition also comprising: an alkali metal compound in an amount of 1.0 mol/ton to 3.0 mouton in terms of alkali metal element; a phosphorus compound in an amount of 1.5 mol/ton to 5.0 mol/ton in terms of elemental phosphorus; and an OCP insoluble matter in an amount of less than 0.5 wt %.

The "OCP insoluble matter" refers to a residue which is obtained by dissolving 1.0 g of the polyethylene terephthalate composition in 50 ml of OCP at 160° C. for 40 minutes and filtering the resultant through a glass filter (3G3).

From the standpoint of attaining excellent mechanical properties, it is preferred that the polyethylene terephthalate composition comprise not less than 95 mol % of ethylene terephthalate units as constitutional unit, and from the standpoint of attaining excellent hydrolysis resistance, it is more preferred that the amount of the ethylene terephthalate units be not less than 99 mol %.

From the standpoints of attaining excellent hydrolysis resistance and retention of elongation and inhibiting the generation of OCP insoluble matter, it is required that the polyethylene terephthalate composition comprise a copolymer component having at least 3 functional groups in an amount of 0.01 mol % to 1.00 mol % with respect to the ethylene terephthalate units, and from the standpoints of attaining excellent resistance to hydrolysis reaction and inhibiting the generation of OCP insoluble matter, it is preferred that the amount of the copolymer component having at least 3 functional groups be 0.05 mol % to 0.80 mol %. Further, from the standpoint of attaining good drawing properties in resulting film and in particular, from the viewpoint that the retention of elongation of the film in a long-term use can be further improved by stretching the film at a high draw ratio and highly orienting the film, the amount of the copolymer component having at least 3 functional groups is more preferably 0.07 mol % to 0.50 mol %, still more preferably 0.05 mol % to 0.20 mol %. Any of these preferred lower limit values may be combined with any of these preferred upper limit values. When the amount of the copolymer component having at least 3 functional groups is less than 0.01 mol %, sufficient hydrolysis resistance and retention of elongation cannot be attained, while when it exceeds 1.00 mol %, an OCP insoluble matter is generated, causing formation of coarse protrusions and irregular thickness when the polyethylene terephthalate composition is made into a film.

Examples of the copolymer component having at least 3 functional groups include polycarboxylic acids, such as those trimer acids obtained by trimerizing trimellitic acid, cyclohexane tricarboxylic acid, biphenyltetracarboxylic acid, pyromellitic acid, butane tetracarboxylic acid or long-chain aliphatic carboxylic acid, and anhydrides and esters thereof; polyalcohols such as those derived from glycerin, pentaerythritol, dipentaerythritol, trimethylolpropane, ditrimethylolpropane, trihydroxybenzene and trihydroxyhexane; and polyhydroxycarboxylic acids, such as citric acid, dihydroxybenzene carboxylic acid and dihydroxynaphthalene carboxylic acid, and anhydrides and esters thereof. In particular, it is preferred that the number of functional groups in the copolymer component be 3 from the standpoints of attaining excellent retention of elongation and drawing properties and reducing the amount of OCP insoluble matter. As a method of adding such copolymer component having at least 3 functional groups, from the standpoints of attaining good handling properties and reducing the amount of OCP insoluble matter, in cases where the copolymer component is a polycarboxylic acid ester or a polyalcohol, it is preferably added prior to the transesterification reaction, and in the case of a polycarboxylic acid, it is preferably added in the form of an ethylene glycol solution or a slurry.

As for the molecular weight distribution of the polyethylene terephthalate composition, from the standpoints of attaining excellent retention of elongation and reducing the amount of OCP insoluble matter, it is required that the ratio (Mw/Mn) of the weight average molecular weight and the number average molecular weight be 5.0 to 8.0. Further, from the standpoint of reducing the amount of OCP insoluble matter, it is more preferred that the ratio Mw/Mn be 5.0 to 7.0. When the ratio Mw/Mn is lower than 5.0, sufficient retention of elongation cannot be attained. Meanwhile, when the ratio Mw/Mn is higher than 8.0, OCP insoluble matter is likely to be generated and the melt viscosity becomes high as well, so that the casting properties at the time of film formation are impaired.

A ratio Mw/Mn can be attained at 5.0 to 8.0 by controlling the intrinsic viscosity to not lower than 0.70 in the presence of a copolymer component having at least 3 functional groups. It is effective to increase the polymerization degree by performing solid-phase polymerization to increase the ratio Mw/Mn. Further, since the ratio Mw/Mn is also dependent on the copolymer component, to further increase the ratio Mw/Mn, it is effective to increase the amount of the copolymer component having at least 3 functional groups or use a copolymer component having a larger number of functional groups.

With regard to the molecular weight of the polyethylene terephthalate composition, from the standpoint of attaining excellent hydrolysis resistance and retention of elongation, it is preferred that the number average molecular weight of the composition be not less than 10,000.

From the standpoint of attaining excellent hydrolysis resistance, the polyethylene terephthalate composition is required to comprise an alkali metal compound in an amount of 1.0 mol/ton to 3.0 mol/ton in terms of alkali metal element, and from the standpoint of attaining excellent hydrolysis resistance, it is preferred that the content of the alkali metal compound be 1.0 mol/ton to 2.0 mol/ton. When the content of the alkali metal compound is less than 1.0 mol/ton in terms of alkali metal element, sufficient hydrolysis resistance cannot be attained. Meanwhile, when it exceeds 3.0 mol/ton in terms of alkali metal element, hydrolysis reaction is facilitated.

Examples of the alkali metal element contained in the polyethylene terephthalate composition include sodium, potassium and lithium. Thereamong, it is preferred that the alkali metal element be sodium or potassium from the standpoint of attaining excellent hydrolysis resistance. It is also preferred that the compound containing the alkali metal element be a hydroxide or phosphate from the standpoint of attaining excellent hydrolysis resistance. From the standpoint of the solubility to polyester, it is more preferred that the compound containing the alkali metal element be a sodium phosphate. Among sodium phosphates, it is still more preferred that the compound containing the alkali metal element be sodium dihydrogen phosphate from the standpoint of attaining excellent hydrolysis resistance.

From the standpoint of attaining excellent hydrolysis resistance, the polyethylene terephthalate composition is required to comprise a phosphorus compound in an amount of 1.5 mol/ton to 5.0 mol/ton in terms of elemental phosphorus, and it is preferred that the content of the phosphorus compound be 2.0 mol/ton to 4.0 mol/ton in terms of elemental phosphorus. When the content of the phosphorus compound is less than 1.5 mol/ton in terms of elemental phosphorus, sufficient hydrolysis cannot be attained. Meanwhile, when the content of elemental phosphorus exceeds 5.0 mol/ton, the amount of COOH terminal groups is likely to be increased due to a delay in the polycondensation reaction and hydrolysis reaction is facilitated. As the compound containing elemental phosphorus, phosphoric acid, phosphoric acid ester, alkali metal phosphate or the like can be employed. From the standpoint of attaining excellent hydrolysis resistance, it is preferred to use phosphoric acid and an alkali metal phosphate in combination.

The OCP insoluble matter contained in the polyethylene terephthalate composition is converted into a foreign substance when the composition is made into a film. Therefore, it is preferred that the content thereof be less than 0.50 wt % with respect to the polyethylene terephthalate composition. When the content of OCP insoluble matter is 0.50 wt % or greater, there arise drawbacks such as formation of fish-eyes when the composition is made into a film.

To attain the content of OCP insoluble matter at less than 0.50 wt %, it is effective to shorten the duration of the polycondensation reaction where the composition is allowed to react in a molten state. For example, melt-polymerization reaction may be terminated at an intrinsic viscosity of 0.50 to 0.60 and then solid-phase polymerization may be performed at 210° C. to 230° C. In solid-phase polymerization, since, as compared to an ordinary polycondensation reaction, the reaction temperature is low and the molecular mobility is also low, gelation by cross-linking is not likely to progress. Therefore, solid-phase polymerization is effective in reducing the amount of OCP insoluble matter.

From the standpoint of attaining excellent hydrolysis resistance, the amount of COOH terminal groups is preferably not greater than 15 eq/ton, more preferably 12 eq/ton in the polyethylene terephthalate composition.

From the standpoint of attaining excellent hydrolysis resistance, the content of cyclic trimer in the polyethylene terephthalate composition is preferably not greater than 0.50 wt %. The "cyclic trimer" refers to a compound in which trimers of the ethylene terephthalate units are circularized by intramolecular reaction, and in a condition where polyethylene terephthalate composition is in a molten state, it is known that the cyclic trimer is saturated at a content of about 1.0 wt %. The content of this cyclic trimer can be reduced by removing it in a solid-phase state at the time of solid-phase polymerization of the polyethylene terephthalate composition. However, when the polyethylene terephthalate composition is melted, the cyclic trimer is generated again and the amount thereof eventually reaches about 1.0 wt %, which is equivalent to the saturating concentration thereof. Such cyclic trimer is generated by esterification between OH terminal groups and COOH terminal groups contained in the polyethylene terephthalate molecules when the polyethylene terephthalate composition is in a molten state. Therefore, by controlling the cyclic trimer content at not greater than 0.50 wt %, there is an effect to inhibit an increase in the amount of COOH terminal groups at the time of melting the polyethylene terephthalate composition.

The temperature condition of the solid-phase polymerization may be controlled at 210° C. to 230° C. to attain the cyclic trimer content at not greater than 0.5 wt %.

In the polyethylene terephthalate composition, from the standpoint of attaining excellent retention of elongation, an increase in the amount of COOH terminal groups (hereinafter, referred to as "ΔCOOH") when an unstretched film thereof is treated at 155° C. in water vapor for 4 hours is preferably not greater than 40 eq/ton, more preferably not greater than 30 eq/ton.

It is effective to reduce the amount of COOH terminal groups before the treatment as much as possible to attain the ΔCOOH at not greater than 40 eq/ton. However, since there is a limit to how much COOH terminal groups can be reduced without using a sequestering agent, from the standpoint of attaining excellent hydrolysis resistance, it is effective to suppress the rate of decomposition reaction using, for example, a buffer such as phosphoric acid/alkali metal phosphate.

From the standpoint of attaining excellent hydrolysis resistance as well as excellent electrostatic characteristics at the time of film formation, the molar ratio of the alkaline earth metal element and elemental phosphorus that are contained in the polyethylene terephthalate composition is preferably 0.5 to 1.5, more preferably 0.7 to 1.3. Any of these preferred lower limit values may be combined with any of these preferred upper limit values. From the standpoints of attaining excellent polycondensation reactivity as well as excellent solubility to polyethylene terephthalate and inhibiting the generation of OCP insoluble matter, the alkaline earth metal compound is preferably an acetate, and specific examples thereof include magnesium acetate and calcium acetate.

The polyethylene terephthalate composition can be produced by performing a polycondensation reaction and, as required, a solid-phase polymerization via an esterification reaction or transesterification reaction.

As such a production method, the polyethylene terephthalate composition can be produced by performing an esterification reaction or transesterification reaction and then a polycondensation reaction.

In cases where a polycondensation reaction is performed after a transesterification reaction, as a catalyst of the transesterification reaction, known catalysts such as magnesium acetate, calcium acetate, zinc acetate, manganese acetate, cobalt acetate, tetrabutoxytitanate, aluminum acetate and lithium acetate can be employed. Thereamong, from the standpoint of attaining excellent hydrolysis resistance as well as excellent electrostatic characteristics at the time of film formation, it is preferred to use magnesium acetate or calcium acetate as the catalyst.

In the method of producing a polyethylene terephthalate composition, as a method of adding a copolymer component having at least 3 functional groups, from the standpoint of attaining good transesterification reactivity, polycondensation reactivity and handling properties, it is preferred to change the timing of the addition depending on the type of the terminal group of the copolymer component. Specifically, in cases where the terminal group of the copolymer component is OH group, it is preferred that the copolymer component be added at an arbitrary time between before the transesterification reaction and the start of the polycondensation reaction, and in cases where the terminal group of the copolymer component is COOH group, it is preferred that the copolymer component be added after the transesterification reaction. Further, in cases where the terminal group of the copolymer component is an ester group, it is preferred that the addition be performed prior to the transesterification reaction. Moreover, in the case of a compound having both OH group and COOH group at the same time such as a hydroxycarboxylic acid, from the standpoint of attaining good transesterification reactivity and polycondensation reactivity, it is preferred to employ the addition method used when the terminal group is COOH group, that is, to add the copolymer component after the transesterification reaction.

As a catalyst used in the polycondensation reaction, a known compound can be employed. Examples of preferred catalysts include antimony trioxide, titanium alkoxide, titanium chelate compound and germanium dioxide. Thereamong, from the standpoint of attaining good polycondensation reactivity and heat resistance, antimony trioxide is more preferred.

In the method of producing a polyethylene terephthalate composition, from the stand-point of reducing the ΔCOOH, an ethylene glycol solution or slurry of a phosphoric acid and an alkali metal phosphate whose pH is adjusted to 2.0 to 6.0 are added at a time between substantial completion of the esterification reaction or transesterification reaction and the start of polycondensation reaction. Further, from the standpoint of attaining excellent retention of elongation, it is preferred that the pH of the above-described ethylene glycol solution or slurry be 2.0 to 5.0.

As a condition of polycondensation reaction, from the standpoint of reducing the amount of COOH terminal groups, it is preferred that the final achievement temperature be 275° C. to 285° C. Further, from the standpoint of reducing the amounts of COOH terminal groups and OCP insoluble matter, it is preferred that the polyethylene terephthalate composition be made into a chip at the time when the intrinsic viscosity thereof reached 0.50 to 0.60. Moreover, for a reduction in the amount of COOH terminal groups, it is also effective to shorten the duration of the polycondensation reaction by lowering the amount of material polyethylene terephthalate to be loaded into a polymerization vessel. However, in this case, the amount of production per batch is reduced.

A polyethylene terephthalate composition obtained in the above-described manner can be subjected to solid-phase polymerization to further reduce the amount of COOH terminal groups, thereby the retention of elongation can be improved. In the method of producing a polyethylene terephthalate composition, a polyethylene terephthalate composition is obtained by performing a polycondensation reaction after esterification reaction, and from the standpoint of improving the polycondensation reactivity, it is preferred to add a copolymer component having at least 3 functional groups in the period between completion of the esterification reaction and the start of the polycondensation reaction. Particularly, in the case of esterification reaction, a large amount of COOH terminal groups remains unreacted. Therefore, by adding a copolymer component having at least 3 functional groups in the form of an ethylene glycol solution or slurry in the period between substantial completion of the esterification reaction and the start of the polycondensation reaction, the COOH terminal groups can be esterified with ethylene glycol, so that the amount of COOH terminal groups can be reduced. In this case, with regard to the amount of ethylene glycol, from the standpoint of reducing the amounts of COOH terminal groups and OCP insoluble matter, it is preferred that the total amount of ethylene glycol added during the period between completion of the esterification reaction and the start of the polycondensation reaction be 0.3 times by mole to 0.5 times by mole with respect to the total acid components contained in the polyethylene terephthalate composition. Ethylene glycol alone may also be added separately as long as the total amount of ethylene glycol added during the period between completion of the esterification reaction and the start of the polycondensation reaction stays within the range of 0.3 times by mole to 0.5 times by mole with respect to the total acid components contained in the polyethylene terephthalate composition.

A specific example of the method of producing a polyethylene terephthalate composition will now be described for the case where trimethyl trimellitate (trifunctional) is used as the copolymer component having at least 3 functional groups. However, this disclosure is not restricted thereto, and a polyethylene terephthalate composition can be produced in the same manner using other multi-functional compound as well.

As a monomer, dimethyl terephthalate, trimethyl trimellitate and ethylene glycol are loaded. In this case, for example, to attain the retention of elongation after a 72 hour treatment at a temperature of 125° C. and a humidity of 100% RH at not lower than 70%, the amount of trimethyl trimellitate is controlled at 0.01 mol % to 1.00 mol % with respect to dimethyl terephthalate. In cases where the resulting polyethylene terephthalate composition is used for a long period of time in an environment where humidity fluctuations are large, such as solar cell applications, it is important to increase the retention of elongation at the time of moist heat treatment. As a catalyst of transesterification reaction, magnesium acetate tetrahydrate or antimony trioxide is employed. After melting the reactants at 150° C. under a nitrogen atmosphere, the temperature is raised to 230° C. with stirring, and while distilling methanol, transesterification reaction is performed. From the standpoint of the transesterification reactivity and electrostatic characteristics, the amount of magnesium acetate tetrahydrate is sufficient at 0.04 parts by weight to 0.08 parts by weight with respect to 100 parts by weight of the polyethylene terephthalate composition. Further, from the standpoint of the polycondensation reactivity, the amount of antimony trioxide is sufficient at 0.025 parts by weight to 0.035 parts by weight with respect to 100 parts by weight of the polyethylene terephthalate composition.

After completion of the transesterification reaction, an ethylene glycol solution (pH 5.0) prepared by dissolving 0.019 parts by weight (equivalent to phosphorus atom 1.9 mol/ton) of phosphoric acid and 0.027 parts by weight (equivalent to phosphorus atom 1.7 mol/ton and sodium atom 1.7 mol/ton) of sodium dihydrogen phosphate dihydrate in 0.5 parts by weight of ethylene glycol is added to 100 parts by weight of the polyethylene terephthalate composition. To attain the retention of elongation after a 72 hour treatment at a temperature of 125° C. and a humidity of 100% RH at not lower than 70%, the amount of phosphorus atom and that of sodium metal atom are controlled at 1.5 mol/ton to 5.0 mol/ton and 1.0 mol/ton to 3.0 mol/ton, respectively, with respect to the polyethylene terephthalate composition. Further, it is preferred that the molar ratio of sodium atom/phosphorus atom be 0.5 to 1.5 and that the pH of the ethylene glycol solution of phosphoric acid and sodium dihydrogen phosphate dihydrate be adjusted to 2.0 to 6.0. By these, the ΔCOOH can be maintained at not greater than 40 eq/ton and the retention of elongation can be attained at not lower than 80%.

The polycondensation reaction is performed, for example, at a final achievement temperature of 280° C. and a degree of vacuum of 0.1 Torr. The resultant is ejected when the intrinsic viscosity reaches a value equivalent to 0.54 and then made into a chip using a strand cutter. By controlling the melt viscosity at the time of ejection to be equivalent to an intrinsic viscosity of 0.50 to 0.60, the amount of OCP insoluble matter can be attained at less than 0.50 wt %.

After drying and crystallizing the thus obtained polymer chip, for example, at a temperature of 150° C. and a degree of vacuum of 0.1 Torr for 4 hours, the resultant is subjected to a 6 hour solid-phase polymerization at a temperature of 220° C. and a degree of vacuum of 0.3 Torr to obtain the polyethylene terephthalate composition. With regard to the conditions of drying and crystallization, the drying can be sufficiently performed under reduced pressure at a temperature of 140° C. to 160° C. for at least 4 hours. As for the conditions of solid-phase polymerization, by performing solid-phase polymerization at a temperature of 210° C. to 230° C. and a degree of vacuum of not lower than 0.3 Torr for a period of 4 to 10 hours, a ratio Mw/Mn of 5.0 to 8.0, an amount of COOH terminal groups of not greater than 15 eq/ton and an amount of cyclic trimer of not greater than 0.50 wt % can be attained.

A polyethylene terephthalate composition obtained in this manner can be dried in accordance with a conventional method and then made into an unstretched film by extrusion using a conventional extruder and T-die, which unstretched film can thereafter be made into a biaxially stretched film through a biaxially stretching step. Specific method thereof will be described below.

In the production method thereof, first, raw materials are loaded into an extruder (a plurality of extruders in cases where a plurality of layers are laminated by a co-extrusion method) and melt-extruded from a die mouthpiece (co-extrusion in the case of a laminate structure). Then, the resultant is electrostatically adhered, cooled and solidified on a drum which is cooled to have a surface temperature of 10° C. to 60° C. to prepare an unstretched film.

The thus obtained unstretched film is biaxially stretched at a temperature not lower than its glass transition temperature (Tg). As a method of biaxial stretching the film, either of a sequential biaxial stretching method in which, as described in the above, stretching is performed separately in the longitudinal direction and the width direction and a simultaneous biaxial stretching method in which stretching is performed simultaneously in both the longitudinal and width directions may be employed.

The polyethylene terephthalate film comprises at least one polyethylene terephthalate film layer (hereinafter, referred to as "P-layer") composed of the above-described polyethylene terephthalate composition and it may be a single-layer film. However, it is also preferred to laminate a separate layer composed of a different material on the P-layer.

As a method of forming a separate layer composed of a different material on the P-layer, in addition to those methods such as the above-described co-extrusion method, melt lamination method, solution-laminating method and heat lamination method, dry methods such as deposition method and sputtering method as well as wet methods such as plating method are also preferred. Examples of a method of forming a separate layer composed of a different material by a coating method include an in-line coating method in which a separate layer is coated during film formation and an off-line coating method in which a separate layer is coated after film formation, and either of these methods can be employed. Still, an in-line coating method is more preferred since it can be performed simultaneously with film formation and is thus efficient and a high adhesion to the film substrate can be attained. Further, prior to such coating process, it is also preferred to perform a corona treatment on the film surface in advance.

A film which comprises a P-layer composed of a polyethylene terephthalate composition obtained by the above-described method not only has excellent hydrolysis resistance but also contains cross-linked structures in the film. Therefore, it becomes possible to restrict the movement of molecular chains, inhibit ingress of water and suppress the changes in higher-order structure after hydrolysis so that a drastically high wet-heat resistance can be attained as compared to conventional polyethylene terephthalate films. Specifically, for example, such a film is suitable for applications where it is used for a long period of time in an environment having large humidity fluctuations, such as solar cell applications. Further, for those applications where the film is used for even longer period of time, it is preferred that the retention of elongation after a 72 hour treatment at a temperature of 125° C. and a humidity of 100% RH be not lower than 80%. It is more preferred that the retention of elongation after a 96 hour treatment at a temperature of 125° C. and a humidity of 100% RH be controlled at not lower than 10%, still more preferably not lower than 20%.

To further increase the retention of elongation after a 72 hour treatment at a temperature of 125° C. and a humidity of 100% RH, it is effective, for example, to take a measure to reduce the amount of COOH terminal groups, such as performing the chip supply to the extruder under a nitrogen atmosphere or shortening the time before extrusion from the T-die, and to set the draw ratio of the film to not less than 10 times, particularly not less than 12 times, in terms of the effective area magnification rate. Further, to attain the retention of elongation after a 96 hour treatment at a temperature of 125° C. and a humidity of 100% RH at not lower than 10%, it is effective to set the effective area magnification rate at not less than 13 times and the planar orientation coefficient at not lower than 0.150.

From the standpoint of attaining excellent hydrolysis resistance in the polyethylene terephthalate film, the amount of COOH terminal groups in the polyethylene terephthalate composition constituting the P-layer after film formation is preferably not greater than 20 eq/ton, more preferably not greater than 18 eq/ton, still more preferably not greater than 16 eq/ton. By controlling the amount of COOH terminal groups in the polyethylene terephthalate composition constituting the P-layer after film formation at not greater than 20 eq/ton, the catalytic action by the protons of the COOH terminal groups can be suppressed and facilitation of hydrolysis can be inhibited, so that progress of degradation can be prevented. To attain the amount of COOH terminal groups at not greater than 20 eq/ton, for example, [1] a method of reducing the amount of COOH contained in the polyethylene terephthalate composition before melt extrusion (for example, by use of solid-phase polymerization or sequestering agent), [2] a method of suppressing decomposition reaction using an additive (such as a buffer, antioxidant or heat-resistant stabilizer) and [3] a method of blocking oxygen in the extruder with nitrogen blow at the time of melt extrusion may be used in combination. Further, a method of adding a buffer and/or sequestering agent at the time of molding is also effective.

From the standpoint of attaining excellent hydrolysis resistance and retention of elongation, it is preferred that the planar orientation coefficient of the P-layer be not less than 0.150 in the polyethylene terephthalate film. The planar orientation coefficient of the P-layer is more preferably not lower than 0.155, still more preferably not lower than 0.160, particularly preferably not lower than 0.168. When the planar orientation coefficient is not lower than 0.150, oriented crystallization is sufficient and a large portion of the film is thus orientationally crystallized. In addition, since the movement of non-crystalline part can be suppressed, ingress of water between molecular chains is prevented so that a high wet-heat resistance can be attained as compared to conventional films.

In the polyethylene terephthalate film, since the polyethylene terephthalate composition forming the P-layer has a branched structure, as compared to a linear polyethylene terephthalate which does not have a branched structure, the polyethylene terephthalate composition is less regularly structured, and in an unoriented condition after being rapidly cooled from a molten state, the molecular chains are strongly entangled each other. Therefore, it is more difficult to attain orientation in the polyethylene terephthalate composition as compared to a polyethylene terephthalate which does not have a branched structure. To attain the planar orientation coefficient at not lower than 0.150, [1] in the case of simultaneous biaxial stretching, the drawing temperature can be set in the range of not lower than the glass transition temperature (Tg) of the polyethylene terephthalate composition to not higher than Tg+15° C., and [2] in the case of sequential biaxial stretching, by performing the first axial stretching at a temperature of not lower than the glass transition temperature (Tg) of the polyethylene terephthalate composition and not higher than Tg+15° C. (more preferably not higher than Tg+10° C.) and the second axial stretching at a temperature in the range of Tg+5° C. to Tg+25° C., the film can be stretched such that the area draw ratio is not less than 12 times, more preferably not less than 13 times, still more preferably not less than 14 times, particularly preferably not less than 15 times, most preferably not less than 16 times.

To complete crystallization and orientation of the thus obtained polyethylene terephthalate film and impart flatness and dimensional stability, the film is subjected to a heat treatment at a temperature of not lower than the Tg and lower than the melting point of the polyethylene terephthalate composition for a period of 1 second to 30 seconds and then allowed to cool uniformly, followed by cooling to room temperature. In general, the heat shrinkage rate of a film becomes large when the heat treatment temperature (Th) is low. Therefore, to impart high thermal dimensional stability, a higher heat treatment temperature (Th) is preferred. However, when the heat treatment temperature (Th) is excessively high, the non-crystalline part is relaxed and the molecular mobility becomes high. Therefore, hydrolysis is likely to occur and in a moist and hot atmosphere, thermal crystallization is facilitated after hydrolysis, so that embrittlement of the film proceeds. Therefore, in the method of producing the polyethylene terephthalate film, the difference (Tm−Th) between the heat treatment temperature (Th) and the melting point (Tm) of the polyethylene terephthalate composition is controlled at 35° C. to 90° C. This difference Tm−Th is preferably 50° C. to 80° C., more preferably 55° C. to 75° C. Any of these preferred lower limit values may be combined with any of these preferred upper limit values. It is noted here that the minimal endothermic peak temperature (Tmetap) can also be controlled by controlling the Th. Further, in the above-described heat treatment step, as required, the film may also be subjected to a relaxation treatment of 3 to 12% in the width direction or lengthwise direction. Subsequently, by performing a corona discharge treatment and the like as required to further improve the adhesion with other materials and then rolling up the resulting film, the P-layer of the polyethylene terephthalate film can be formed.

It is preferred in the P-layer of the polyethylene terephthalate film that the difference Tm−Tmetap between the melting point (Tm) of the P-layer, which is determined by differential scanning calorimetry (hereinafter, referred to as "DSC"), and the minimal endothermic peak temperature (Tmetap) of the P-layer be 40° C. to 90° C. The "Tmetap" and "melting point (Tm)" of the P-layer refer to values in the heating process (heating rate: 20° C./min), which are determined by DSC. Specifically, in accordance with a method based on JIS K 7121 (1999), the film is heated from 25° C. to 300° C. at a heating rate of 20° C./min (1stRUN) and maintained at the temperature for 5 minutes, followed by rapid cooling to a temperature of not higher than 25° C. The film is then once again heated from room temperature to 300° C. at a heating rate of 20° C./min (2ndRUN). In the resulting DSC measurement chart, the minimal endothermic peak temperature before the crystal melting peak of the 1stRUN is defined as Tmetap and the peak top temperature at the crystal melting peak of the 2ndRUN is defined as Tm.

The difference Tm−Tmetap is more preferably 50° C. to 80° C., still more preferably 55° C. to 75° C., particularly preferably 60° C. to 75° C. Any of these preferred lower limit values may be combined with any of these preferred upper limit values. In the polyethylene terephthalate film, by setting the difference Tm−Tmetap between the melting point (Tm) and the minimal endothermic peak temperature (Tmetap) of the P-layer at 40° C. to 90° C., a reduction in the shrinkage rate and satisfactory wet-heat resistance can be attained at the same time.

Further, it is preferred that the Tmetap of the P-layer in the polyethylene terephthalate film be in the range of not lower than 160° C. to not higher than Tm−40° C. (provided that Tm−40° C.>160° C.). The Tmetap is more preferably in the range of not lower than 170° C. to not higher than Tm−50° C. (provided that Tm−50° C.>170° C.), still more preferably not lower than 180° C. to not higher than Tm−55° C. (provided that Tm−55° C.>180° C.), particularly preferably not lower than 180° C. to not higher than Tm−60° C. (provided that Tm−60° C.>180° C.). Any of these preferred lower limit values may be combined with any of these preferred upper limit values. By controlling the Tmetap at not lower than 160° C., an excessive heat shrinkage of the film can be prevented and, for example, in cases where the polyester film is used as a film for solar cell backsheet, in the step of pasting the film for integration, the pasting process can be easily performed, and warping of a solar cell can be prevented when the film is integrated into the solar cell and used for a prolonged period of time.

Further, from the standpoint of heat resistance, the melting point (Tm) of the P-layer in the polyethylene terephthalate film is preferably not lower than 240° C., more preferably not lower than 250° C.

The polyethylene terephthalate film can be preferably used in both cases where the film is composed of only a single layer of the above-described P-layer and where the film has a laminated structure comprising a separate layer made of a different material (hereinafter, referred to as "P'-layer"). In cases where the film has a laminated structure, to allow the effect of high wet-heat resistance of the above-described polyester layer to be exhibited, it is preferred that the ratio of the P-layer be not less than 40% of the entire polyethylene terephthalate film. The ratio of the P-layer is more preferably not less than 50%, still more preferably not less than 70%, particularly preferably not less than 80%.

The P-layer in the polyethylene terephthalate film has a thickness of preferably 10 μm to 500 μm, more preferably 20 μm to 300 μm, still more preferably 25 μm to 200 μm. Any of these preferred lower limit values may be combined with any of these preferred upper limit values. By controlling the thickness of the P-layer at 10 μm to 500 μm, the film can have excellent wet-heat resistance and the total thickness of the resulting solar cell will not be excessively large.

Further, the total thickness of the polyethylene terephthalate film is preferably 10 μm to 500 μm, more preferably 20 μm to 300 μm, still more preferably 25 μm to 200 μm. Any of these preferred lower limit values may be combined with any of these preferred upper limit values. By controlling the total thickness at 10 μm to 500 μm, the surface smoothness of the film can be easily secured and the total thickness of the resulting solar cell will not be excessively large.

As the P'-layer laminated on the P-layer, an arbitrary layer, for example, a polyester layer for imparting a function, an antistatic layer, adhesive layer for adhesion with other material, an UV resistant layer for providing resistance to UV rays, a flame retardant layer for imparting flame retardancy or a hard coat layer for improving the impact resistance and abrasion resistance, can be formed in accordance with the intended use of the film. As specific examples of such layer, in cases where the polyethylene terephthalate film is used as a film for solar cell backsheet, in addition to an adhesion-promoting layer for improvement of the adhesion with ethylene vinyl acetate embedding other sheet material(s) and power generation device(s), an UV resistant layer and a flame retardant layer, an electroconductive layer which improves the voltage generated in the partial discharge phenomenon which is an index of insulation properties can also be formed.

In cases where, as the P'-layer, a layer composed of other polyester comprising ethylene terephthalate as its main repeating unit is formed on the P-layer, the polyester resin constituting this other polyester has an intrinsic viscosity (IV) of preferably not lower than 0.65, more preferably not lower than 0.68, still more preferably not lower than 0.70, particularly preferably not lower than 0.72. When the IV of this other polyester resin constituting the P'-layer is not lower than 0.65, since the molecular weight is at an appropriate level and when the film is exposed to a moist and hot atmosphere, hydrolysis and subsequent thermal crystallization of the P'-layer do not proceed excessively, the P'-layer is hardly embrittled and the film is thus not likely to be fractured. Therefore, a function(s) can be imparted without impairing a high wet-heat resistance attained by the P-layer. Although the upper limit of the IV is not particularly prescribed, from the standpoints of avoiding a prolonged polymerization time, which causes a cost disadvantage, and preventing melt extrusion from becoming difficult, the IV is preferably not higher than 1.0, more preferably not higher than 0.90.

The amount of COOH terminal groups in the above-described other polyester constituting the P'-layer is preferably not greater than 20 eq/ton, more preferably not greater than 18 eq/ton, still more preferably not greater than 16 eq/ton. When the amount of COOH terminal groups is not greater than 20 eq/ton, the catalytic action by the protons of the COOH terminal groups in the P'-layer is weak and hydrolysis and subsequent thermal crystallization of the P'-layer do not proceed excessively. Therefore, the P'-layer is hardly embrittled and the film is thus not likely to be fractured. Further, since the protons generated from the COOH terminal groups in the P'-layer are not likely to diffuse into the P-layer, hydrolysis of the P-layer is also not facilitated. Therefore, a function(s) can be imparted without impairing a high wet-heat resistance attained by the P-layer.

In cases where other polyester layer is formed as the P'-layer, within the range where the effects are not adversely affected, for example, an additive(s), such as heat-resistant stabilizer, antioxidant stabilizer, UV absorbing agent, UV stabilizer, organic/inorganic lubricant, organic/inorganic fine particle, filler, nucleating agent, dye, dispersant and/or coupling agent, as well as air bubbles may also be blended as required to impart a variety of functions.

In the polyethylene terephthalate composition produced in the above-described manner, the amount of COOH terminal groups is small and short-term hydrolysis resistance is good. Not only that, a film composed of the polyethylene terephthalate composition also has good long-term hydrolysis resistance and retention of elongation, which are required in those application such as solar cell films, particularly solar cell backsheets. Moreover, utilizing the characteristics of the polyethylene terephthalate composition, the composition can be suitably used in those applications where flame retardancy is of importance, such as copper-clad laminated plates, adhesive tapes, flexible printed boards, membrane switches, planar heating elements, electrical insulation materials such as flat cables, capacitor materials, automobile materials and building materials.

As the constitution of a solar cell backsheet comprising the polyethylene terephthalate film, an arbitrary constitution can be employed, and the solar cell backsheet is constituted by forming on the polyethylene terephthalate film, for example, an ethylene-vinyl acetate copolymer (hereinafter, referred to as "EVA") adhesive layer for improving the adhesion with EVA sealing a power generation device(s); an anchor layer for improving the adhesion with the EVA adhesive layer; an water vapor barrier layer; an UV absorbing layer for preventing degradation by UV rays; a light reflecting layer for improving the power generation efficiency; a light absorbing layer for exhibiting ornamental properties; and adhesive layers for adhering the above-described layers.

The EVA adhesive layer is a layer which improves the adhesion with an EVA-based resin sealing a power generation device(s), and it is provided most proximally to the power generation device to contribute to the adhesion between the backsheet and system. The material of the EVA adhesive layer is not particularly restricted as long as adhesion with an EVA-based resin is expressed. As the material, for example, EVA or a mixture of EVA and ethylene-methyl acrylate copolymer (EMA), ethylene-ethyl acrylate copolymer (EEA), ethylene-butyl acrylate copolymer (EBA), ethylene-methacrylic acid copolymer (EMAA), ionomer resin, polyester resin, urethane resin, acrylic resin, polyethylene resin, polypropylene resin, polyamide resin or the like is preferably employed. Further, to improve the adhesion of the EVA adhesive layer to the backsheet as required, an anchor layer is also preferably formed. The material thereof is not particularly restricted as long as adhesion with the EVA adhesive layer is expressed, and for example, a mixture containing a resin such as acrylic resin or polyester resin as its major constituting component is preferably employed.

The water vapor barrier layer is a layer which, when formed in a solar cell, prevents entry of water vapor from the backsheet side to prevent the power generation device from being degraded by water vapor. The water vapor barrier layer is formed by providing an oxide such as silicon oxide or aluminum oxide or a metal layer of aluminum or the like on the film surface by a well-known method such as vacuum deposition or sputtering. Usually, the thickness thereof is preferably in the range of 10 nm to 20 nm. In this case, the water vapor barrier layer can be preferably used in both cases where a gas barrier layer is provided directly on the polyester film and where a gas barrier layer is formed on a separate film and this film is then laminated on the surface of the film. Further, a method of laminating a metal foil (for example, an aluminum foil) on the film surface can also be employed. In this case, from the standpoint of processability and gas barrier property, it is preferred that the thickness of the metal foil be in the range of 10 μm to 50 μm.

The UV absorbing layer is a layer which blocks UV rays to prevent degradation of inner layer resin by UV rays, and it may be an arbitrary one as long as it has a function to block UV rays at a wavelength of not longer than 380 nm. The light reflecting layer is a layer which reflects light, and this layer is formed for the purposes of preventing the degradation of inner layer resin by UV rays and reflecting the light which reached the backsheet without being absorbed by the solar cell system so that the light is returned to the system side, thereby improving the power generation efficiency. The light reflecting layer contains, for example, a white pigment such as titanium oxide or barium sulfate and air bubbles. The light absorbing layer is a layer which absorbs light, and this layer is formed for the purposes of preventing the degradation of inner layer resin by UV rays and improving the ornamental properties of the solar cell.

The solar cell backsheet is formed by combining the above-described layers and the polyethylene terephthalate film. It is noted here that, in the solar cell backsheet, all of the above-described layers are not required to be formed as independent layers, and it is also preferred to form those layers as a multifunctional layer in which a plurality of functions are combined. Further, in cases where the polyethylene terephthalate film already has a specific function, formation of a layer having this specific function can be omitted as well. For example, in cases where the polyethylene terephthalate film is constituted in such a manner to comprise a layer containing a white pigment and air bubbles and thus has a light reflecting property, formation of a light reflecting layer may be omitted, and in cases where the polyethylene terephthalate film is constituted in such a manner to comprise a layer containing a light absorbing agent and thus has a light absorbing property, formation of a light absorbing layer may be omitted. Also, in cases where the polyethylene terephthalate film is constituted in such a manner to comprise a layer containing UV absorbing agent, formation of a UV absorbing layer may be omitted.

As compared to conventional polyethylene terephthalate films, our polyethylene terephthalate film has superior wet-heat resistance. Therefore, a solar cell backsheet containing this film also has superior wet-heat resistance as compared to conventional backsheets. To allow the effect of high wet-heat resistance of the polyethylene terephthalate film to be exhibited in a solar cell backsheet, the volume ratio of the P-layer with respect to the entire backsheet is preferably not lower than 10%, more preferably not lower than 20%, still more preferably not lower than 25%, particularly preferably not lower than 30%, most preferably not lower than 40%.

Utilizing the characteristic of the solar cell backsheet comprising the polyethylene terephthalate film, which is superior wet-heat resistance as compared to conventional backsheets, a solar cell can be made more durable and thinner as compared to conventional solar cells. An example of the constitution thereof is shown in FIG. 1. This solar cell is constituted by power generation devices to which a lead wire (not shown in FIG. 1) for taking out electricity is connected, the power generation devices being sealed by transparent filter 2 of EVA-based resin or the like; and a transparent base material 4 made of glass or the like and a resin sheet referred to as backsheet 1 that are pasted on the filler 2. However, the structure is not restricted to this and an arbitrary constitution may be employed.

A power generation device 3 converts the light energy of sunlight 5 into electric energy and a plural number of an arbitrary device, such as crystalline silicon system, polycrystalline silicon system, amorphous silicon system, copper indium selenide system, compound semiconductor system or dye-sensitized system, can be used in accordance with the purpose thereof by connecting them in series or in parallel depending on the desired voltage or current.

Since the transparent base material 4 having translucency is positioned at the uppermost layer of the solar cell, a transparent material having high antiweatherability, high contamination resistance and high mechanical strength property in addition to high transparency is employed. In our solar cell, as the transparent base material 4 having translucency, any material can be employed as long as the above-described characteristics are satisfied, and preferred examples thereof include glasses; fluorine-based resins such as ethylene tetrafluoride-ethylene copolymer (ETFE), polyvinyl fluoride resin (PVF), polyvinylidene fluoride resin (PVDF), polytetrafluoroethylene resin (TFE), ethylene tetrafluoride-propylene hexafluoride copolymer (FEP), polychlorotrifluoroethylene resin (CTFE) and polyvinylidene fluoride resin; olefin-based resins; acrylic resins; and mixtures thereof. In cases where a glass is used, it is more preferred that the glass be a reinforced one. Further, in cases where a transparent base material made of a resin is used, from the standpoint of attaining excellent mechanical strength, it is also preferred to use uniaxially or biaxially stretched above-described resin.

Further, to impart these base materials an adhesiveness with an EVA-based resin which is a sealant of the power generation devices, it is also preferred to perform a corona treatment, plasma treatment, ozone treatment and/or adhesion-promoting treatment on the surfaces of these base materials.

As the filler 2 used for sealing the power generation devices, in addition to those purposes of covering the surface irregularities of the power generation devices with a resin, immobilizing the power generation devices, protecting them from external environment and providing electrical insulation to provide adhesiveness with the base material having translucency, backsheet and power generation devices, a material having high transparency, high antiweatherability, high adhesive property and high heat resistance is employed. Examples of preferably used material include ethylene-vinyl acetate copolymer (EVA), ethylene-methyl acrylate copolymer (EMA), ethylene-ethyl acrylate copolymer (EEA) resin, ethylene-methacrylic acid copolymer (EMAA), ionomer resin, polyvinyl butyral resin and mixtures thereof. Among these resins, from the standpoint of having excellent balance in the antiweatherability, adhesiveness, filling property, heat resistance, cold resistance and impact resistance, ethylene-vinyl acetate is more preferably used.

In the solar cell, the above-described solar cell backsheet 1 is provided on the back surface of the layer composed of the filler 2 in which the power generation devices are sealed.

As described in the above, by integrating the solar cell backsheet comprising the polyethylene terephthalate film into a solar cell system, a solar cell system which is more durable and/or thinner as compared to conventional solar cells can be obtained. The solar cell can be suitably used in a variety of applications such as photovoltaic power generation systems and power sources of small electronic components regardless of whether it is outdoor use or indoor use.

EXAMPLES (A) Intrinsic Viscosity

In 10 ml of o-chlorophenol, 0.1 g of polymer was dissolved at 160° C. for 20 minutes and the intrinsic viscosity was measured at 25° C.

(B) Quantification of Phosphorus and Metal Element in Polymer

Measurements were performed using a fluorescent X-ray analyzer (Model No.: 3270) manufactured by Rigaku Corporation.

(C) Quantification of Alkali Metal in Polymer

Quantification was performed by atomic absorption spectrophotometry (Polarized Zeeman Atomic Absorption Spectrophotometer 180-80 manufactured by Hitachi, Ltd.; flame: acetylene-air).

(D) Amount of Terminal Carboxylic Acid Group

A chip sample and unstretched sheet sample were collected and measured in accordance with the method of Maulice, et al. (Reference: M. J. Maulice and F. Huizing a, Anal. Chim. Acta., 22:363 (1960)).

(E) Measurement of Molecular Weight Distribution of Polymer

The molecular weight was determined by GPC method.
Detector: differential refractometer RI
Column: Shodex HFIP-806M
Solvent: hexafluoroisopropanol
Standard: polyethylene terephthalate with a known molecular weight (PET-5R, Mw: 55,800) and dimethyl terephthalate (F) Quantification of Cyclic Trimer A polymer was dissolved in hexafluoroisopropanol and cyclic trimer was quantified by high-performance liquid chromatography.

(G) Evaluation of Hydrolysis Resistance ($\Delta$COOH)

An unstretched film of 150 μm in thickness was recovered and treated at 155° C. in water vapor for 4 hours.
Measuring apparatus: PRESSER COOKER 306SIII (manufactured by HIRAYAMA MANUFACTURING CORP.)

The $\Delta$COOH was determined by measuring the amount of carboxylic acid terminal groups for a sample of the unstretched film before and after the water vapor treatment under the above-described conditions and calculating the difference therebetween.

(H) Calculation of Retention of Elongation

The elongation at break of a polyester film was determined in accordance with ASTM-D882 (1999) by cutting out a sample into a size of 1 cm×20 cm and stretching it at a chuck distance of 10 cm and a tensile rate of 200 mm/min to measure the elongation at break. It is noted here that the measurement was carried out for 5 samples and the average value thereof was defined as elongation at break $E_0$. Further, the retention of elongation was determined as the following. After cutting a sample into a measurement piece shape (1 cm×20 cm) and then subjecting it to a 72 hour treatment and 96 hour treatment at a temperature of 125° C. and a humidity of 100% RH using a pressure cooker manufactured by Tabai Espec Corp., the elongation at break of the thus treated sample was measured in accordance with ASTM-D882 (1999) by stretching the sample at a chuck distance of 5 cm and a tensile rate of 200 mm/min. It is noted here that the measurement was carried out for 5 samples and the average value thereof was defined as elongation at break $E_1$. Using the thus obtained values of the elongation at break $E_0$ and $E_1$, the retention of elongation was calculated by the following Equation (2):

$$\text{Retention of elongation (\%)} = E_1/E_0 \times 100 \tag{2}$$

The measurement was carried out in each of the directions of the maximum and minimum refractive indices of the film P-layer (in cases where it was difficult to measure the refractive index of the P-layer, the measurement was carried out in each of the lengthwise direction (longitudinal direction) and the width direction (transverse direction)).

Measuring apparatus: a film strength-elongation measuring apparatus "Tensilon AMF/RTA-100" manufactured by Orientech Co., Ltd.
Sample size: width 10 mm×gauge length 100 mm
Tensile rate: 200 mm/min
Measurement conditions: 23° C., 65% RH A retention of elongation of 70% or higher, which is believed to correspond to a service life of not shorter than 30 years required in solar cell applications, was considered acceptable.

(I) Quantification of OCP Insoluble Matter

In 50 ml of o-chlorophenol, 0.1 g of polymer was dissolved at 160° C. for 40 minutes and the resultant was filtered through a glass filter (3G3).

After the filtration, the resulting residue was washed with dichloromethane and dried with hot air at 130° C. for 10 hours. The thus dried residue was weighed and the amount of OCP insoluble matter was determined in terms of the ratio (wt %) of the residue weight to the amount of the polymer prior to the dissolution.

(J) Measurement of pH

Phosphoric acid and an alkali metal phosphate were weighed to a total of 2 g and dissolved in 100 ml of ethylene glycol to measure the pH.

Measuring apparatus: AT-510 (manufactured by Kyoto Electronics Manufacturing Co., Ltd.)

(K) Planar Orientation Coefficient (fn)

Using a sodium D-line (wavelength: 589 nm) as a light source, the refractive indices of the film are measured by an Abbe refractometer in the planar and thickness directions. Then, the sample is rotated by 10° at a time to measure the refractive indices in the same manner for 360°. From the in-plane distribution of the thus measured refractive indices, defining the maximum refractive index as Nmax, the refractive index in the 90° in-plane direction therefrom as Nmin and the average value of the refractive indices in the thickness direction as Nz, the planar orientation coefficient (Iii) was determined using the following Equation (3):

$$\text{Planar orientation coefficient } (fn) = (N\text{max} + N\text{min})/2 - Nz \quad (3).$$

Example 1

In a transesterification reaction apparatus, 100 parts by weight of dimethyl terephthalate, 0.65 parts by weight of trimethyl trimellitate, 57.5 parts by weight of ethylene glycol, 0.06 parts by weight of magnesium acetate tetrahydrate and 0.03 parts by weight of antimony trioxide were loaded and melted at 150° C. under a nitrogen atmosphere. Then, with stirring, the temperature was raised to 230° C. over a period of 3 hours to distill methanol, thereby performing a transesterification reaction.

After completion of the transesterification reaction, an ethylene glycol solution (pH 5.0) prepared by dissolving 0.019 parts by weight (equivalent to 1.9 mol/ton) of phosphoric acid and 0.027 parts by weight (equivalent to 1.7 mol/ton) of sodium dihydrogen phosphate dihydrate in 0.5 parts by weight of ethylene glycol was added.

The thus obtained reactants were transferred to a polymerization apparatus and the pressure was reduced while raising the temperature from 230° C. to 280° C. to perform a polycondensation reaction at a final achievement temperature of 280° C. and a degree of vacuum of 0.1 Torr. In this manner, a polyethylene terephthalate having an intrinsic viscosity of 0.54 and containing 11 eq/ton of COOH terminal groups was obtained.

After drying and crystallizing the thus obtained polyethylene terephthalate at 160° C. for 6 hours, the resultant was subjected to an 8 hour solid-phase polymerization at a temperature of 220° C. and a degree of vacuum of 0.3 Torr to obtain a polyethylene terephthalate having an intrinsic viscosity of 0.85 and containing 8.0 eq/ton of COOH terminal groups and 0.27 wt % of cyclic trimer. In this polyethylene terephthalate, the amount of copolymerized trimellitic acid component was 0.50 mol % and the ratio Mw/Mn was 6.5, and the polyethylene terephthalate had a number average molecular weight of 11,200 and a melting point (Tm) of 255° C. As described above, the alkaline earth metal species was magnesium and the amount thereof was 2.8 mol/ton. The amount of elemental phosphorus was 3.6 mol/ton, and the molar ratio of alkaline earth metal/elemental phosphorus was 0.77. Further, the amount of OCP insoluble matter was 0.0 wt %.

After the solid-phase polymerization, the thus obtained polyethylene terephthalate was supplied to an extruder under a nitrogen atmosphere and extruded from a T-die at an extrusion temperature of 280° C. into a casting drum (20° C.) to be rapidly cooled. Then, after making the resulting polyethylene terephthalate into a sheet by electro-pinning to obtain an unstretched film, the thus obtained unstretched film was longitudinally stretched at a longitudinal drawing temperature of 90° C. and a longitudinal draw ratio of 3.8 times and then transversally stretched at a transversal drawing temperature of 110° C. and a transversal draw ratio of 3.8 times. The resulting stretched film was then heat-treated for 3 seconds at a heat treatment temperature (Th) of 210° C. to obtain a biaxially stretched film at an effective area magnification rate of 13.2 times. Tm–Th was 45° C.

In this case, a 400-mesh wire cloth was employed as an extruder filter and the retention time between polymer supply and ejection from the T-die was about 3 minutes.

When the hydrolysis resistance was evaluated, it was found that the amounts of COOH terminal groups in the pre-treatment unstretched film and the unstretched film treated in water vapor at 155° C. for 4 hours were 10 eq/ton and 33 eq/ton, respectively. Therefore, the ΔCOOH was satisfactory at 23 eq/ton.

Further, the thus obtained biaxially stretched film was treated at 125° C. and 100% RH for 72 hours and the film elongation was compared before and after the treatment to calculate the retention of elongation, which was found to be 86% and thus at a level where the film can be used in a solar cell or the like with no problem.

Example 2

To an esterification reaction apparatus in which 114 parts by weight of bis-hydroxyethylene terephthalate (equivalent to 100 parts by weight of PET) had been loaded in advance, a slurry composed of 86 parts by weight of terephthalic acid and 37 parts by weight of ethylene glycol was supplied using a snake pump over a period of 3 hours to perform an esterification reaction with the temperature of the reactants being controlled at 245° C. to 255° C.

After completion of the esterification reaction, 114 parts by weight of the resulting bis-hydroxyethylene terephthalate (equivalent to 100 parts by weight of PET) was transferred to a polymerization can. Then, 0.06 parts by weight of magnesium acetate tetrahydrate, 0.03 parts by weight of antimony trioxide and a slurry composed of 0.50 parts by weight of trimellitic anhydride and 16.1 parts by weight (an amount of 0.5 times by mole with respect to the total acid components) of ethylene glycol were sequentially added thereto and the resultant was allowed to react for 30 minutes with stirring to distill water. Thereafter, an ethylene glycol solution (pH 5.0) prepared by dissolving 0.019 parts by weight (equivalent to 1.9 mol/ton) of phosphoric acid and 0.027 parts by weight (equivalent to 1.7 mol/ton) of sodium dihydrogen phosphate dihydrate in 0.5 parts by weight of ethylene glycol was further added and the pressure was reduced while raising the temperature from 255° C. to 280° C. to perform a polycondensation reaction at a final achievement temperature of 280° C. and a degree of vacuum of 0.1 Torr, thereby obtaining a polyethylene terephthalate having an intrinsic viscosity of 0.54 and containing 12 eq/ton of COOH terminal groups.

After drying and crystallizing the thus obtained polyethylene terephthalate at 160° C. for 6 hours, the resultant was subjected to an 8 hour solid-phase polymerization at a temperature of 220° C. and a degree of vacuum of 0.3 Torr to obtain a polyethylene terephthalate having an intrinsic viscosity of 0.85 and containing 8.0 eq/ton of COOH terminal groups and 0.29 wt % of cyclic trimer. In this polyethylene terephthalate, the amount of copolymerized trimellitic acid component was 0.50 mol % and the ratio Mw/Mn was 6.5, and the polyethylene terephthalate had a number average molecular weight of 11,500 and a melting point (Tm) of 255° C. As described in the above, the alkaline earth metal species was magnesium and the amount thereof was 2.8 mol/ton. The amount of elemental phosphorus was 3.6 mol/ton, and the molar ratio of alkaline earth metal/elemental phosphorus was 0.77. In addition, the amount of OCP insoluble matter was 0.0 wt %.

Further, from an unstretched film prepared under the same conditions as in Example 1, a biaxially stretched film was obtained under the same drawing conditions as in Example 1 at an effective area magnification rate of 13.2 times. Tm−Th was 45° C. When the hydrolysis resistance was evaluated, it was found that the amount of COOH terminal groups in the pre-treatment unstretched film and that in the unstretched film treated in water vapor at 155° C. for 4 hours were 10 eq/ton and 33 eq/ton, respectively. Therefore, the ΔCOOH was satisfactory at 23 eq/ton.

Further, the thus obtained biaxially stretched film was treated at 125° C. and 100% RH for 72 hours and the film elongation was compared before and after the treatment to calculate the retention of elongation, which was found to be 86% and thus at a level where the film can be used in a solar cell or the like with no problem.

Examples 3 to 9, 11 and 12, and Comparative Examples 1 to 3

A polyethylene terephthalate having a melting point (Tm) of 255° C. and a biaxially stretched film were obtained in the same manner as in Example 1 except that the types and amounts of the additives were changed as shown in Tables 2 to 4 and the drawing conditions were changes to the following conditions. In Example 3, the thus obtained unstretched film was longitudinally stretched at a longitudinal drawing temperature of 90° C. and a longitudinal draw ratio of 3.3 times and then transversally stretched at a transversal drawing temperature of 110° C. and a transversal draw ratio of 3.5 times. The resulting stretched film was then heat-treated for 3 seconds at a heat treatment temperature (Th) of 210° C. to attain an effective area magnification rate of 10.2 times. In Example 4, the thus obtained unstretched film was longitudinally stretched at a longitudinal drawing temperature of 90° C. and a longitudinal draw ratio of 3.5 times and then transversally stretched at a transversal drawing temperature of 110° C. and a transversal draw ratio of 3.5 times. The resulting stretched film was then heat-treated for 3 seconds at a heat treatment temperature (Th) of 210° C. to attain an effective area magnification rate of 12.1 times. In Example 5, the thus obtained unstretched film was longitudinally stretched at a longitudinal drawing temperature of 90° C. and a longitudinal draw ratio of 3.3 times and then transversally stretched at a transversal drawing temperature of 110° C. and a transversal draw ratio of 3.3 times. The resulting stretched film was then heat-treated for 3 seconds at a heat treatment temperature (Th) of 210° C. to attain an effective area magnification rate of 9.5 times. In Examples 6 to 9, 11 and 12 as well as Comparative Examples 1 to 3, in the same manner as in Example 1, the thus obtained unstretched film was longitudinally stretched at a longitudinal drawing temperature of 90° C. and a longitudinal draw ratio of 3.8 times and then transversally stretched at a transversal drawing temperature of 110° C. and a transversal draw ratio of 3.8 times. The resulting stretched film was then heat-treated for 3 seconds at a heat treatment temperature (Th) of 210° C. to attain an effective area magnification rate of 13.2 times. In all of these Examples and Comparative Examples, Tm−Th was 45° C.

In Example 3, the content of the copolymer component having at least 3 functional groups was close to the lower limit thereof at 0.03 mol %, and as compared to Example 1, the ratio Mw/Mn was small at 5.3 and the effective area magnification rate was also low at 10.2 times, so that the retention of elongation after a 72 hour treatment at 125° C. and 100% RH tended to be slightly decreased at 75%. However, these are at levels where the film can be used in a solar cell or the like with no problem.

In Example 4, since the content of the copolymer component having at least 3 functional groups was close to the upper limit thereof at 0.90 mol %, there were tendencies for, for example, a high Mw/Mn ratio of 7.7 and an increase in the amount of OCP insoluble matter at 0.3 wt %. Further, since the number average molecular weight was below 10,000 at 9,300, the retention of elongation after a 72 hour treatment at 125° C. and 100% RH tended to be slightly decreased at 73%. However, these are at levels where the film can be used in a solar cell or the like with no problem.

In Example 5, since the effective area magnification rate was below 10 times at 9.5 times, the retention of elongation after a 72 hour treatment at 125° C. and 100% RH tended to be decreased at 73%. However, this is at a level where the film can be used in a solar cell or the like with no problem.

In Example 6, since no alkaline earth metal compound was added, the electrostatic characteristics were somewhat insufficient and the irregularities in the film thickness tended to be slightly increased. Further, since the alkali metal content was 1.2 mol/ton, that is, the content of sodium dihydrogen phosphate was close to the lower limit, the ΔCOOH tended to be somewhat large at 35 eq/ton. However, this is at a level where the film can be used in a solar cell or the like with no problem.

In Examples 7 and 8, since the polycondensation reaction was performed to an intrinsic viscosity of 0.65 and the duration of solid-phase polymerization was shortened accordingly, the amounts of COOH terminal groups in the polymers of Examples 7 and 8 tended to be slightly increased at 13 eq/ton and 14 eq/ton, respectively. However, these are at levels where the film can be used in a solar cell or the like with no problem.

In Example 9, the content of elemental phosphorus was close to the upper limit thereof at 4.8 mol/ton and the acidity of the ethylene glycol solution of phosphoric acid and sodium dihydrogen phosphate was strong at pH of 3.0, so that the ΔCOOH was somewhat large at 43 eq/ton. However, this is at a level where the film can be used in a solar cell or the like with no problem.

In Comparative Example 1, since no copolymer component having at least 3 functional groups was added, the ratio Mw/Mn was insufficient at 3.4 and the retention of elongation after a 72 hour treatment at 125° C. and 100% RH was also not satisfactory at 53%.

As compared to Example 1, the amounts of elemental phosphorus, alkali metal and magnesium metal in Example 11 were small at 1.8 mol/ton, 1.0 mol/ton and 1.7 mol/ton, respectively, and the amounts of elemental phosphorus, alkali metal and magnesium metal in Example 12 were also small at 3.0 mol/ton, 1.0 mol/ton and 1.9 mol/ton, respectively, so that the ΔCOOH was 30 eq/ton and 27 eq/ton in the respective Examples 11 and 12. However, these are at levels where the films can be used in a solar cell or the like with no problem.

In Comparative Example 2, the amount of elemental phosphorus was 1.1 mol/ton and that of alkali metal was 0.0 mol/ton, both of which are out of our prescribed ranges so that sufficient hydrolysis reaction-inhibiting effect could not be attained and the retention of elongation after a 72 hour treatment at 125° C. and 100% RH was not satisfactory at 33%.

In Comparative Example 3, since the cross-linking component having at least 3 functional groups was added in an amount of 1.2 mol %, which is above our prescribed range, a large amount (68 wt %) of OCP insoluble matter was generated and a polyethylene terephthalate composition which can be molded into a film could not be obtained.

Example 10

A polyethylene terephthalate composition having a melting point (Tm) of 255° C. was obtained in the same manner as in Example 2 except that trimellitic anhydride was made into a slurry with 4.0 parts by weight (equivalent to an amount of 0.13 times by mole with respect to the total acid components) of ethylene glycol before being added. After making the polyethylene terephthalate composition into an unstretched film, under the same drawing conditions as in Example 2, the thus obtained unstretched film was longitudinally stretched at a longitudinal drawing temperature of 90° C. and a longitudinal draw ratio of 3.8 times and then transversally stretched at a transversal drawing temperature of 110° C. and a transversal draw ratio of 3.8 times. The resulting stretched film was then heat-treated for 3 seconds at a heat treatment temperature (Th) of 210° C. to obtain a biaxially stretched film at an effective area magnification rate of 13.2 times. Tm−Th was 45° C.

Since the amount of ethylene glycol added after the esterification reaction was small as compared to Example 2, the amount of COOH terminal groups in the polymer tended to be increased at 16 eq/ton. However, this is at a level where the film can be used in a solar cell or the like with no problem.

Example 13

In a transesterification reaction apparatus, 100 parts by weight of dimethyl terephthalate, 57.5 parts by weight of ethylene glycol, 0.07 parts by weight of magnesium acetate tetrahydrate and 0.03 parts by weight of antimony trioxide were loaded and melted at 150° C. under a nitrogen atmosphere. Then, with stirring, the temperature was raised to 230° C. over a period of 3 hours to distill methanol, thereby performing a transesterification reaction.

After completion of the transesterification reaction, 0.1 parts by weight of trimellitic anhydride was added as a 10 wt % ethylene glycol solution, and after stirring the resultant for 10 minutes, an ethylene glycol solution (pH 5.0) prepared by dissolving 0.019 parts by weight (equivalent to 1.9 mol/ton) of phosphoric acid and 0.027 parts by weight (equivalent to 1.7 mol/ton) of sodium dihydrogen phosphate dihydrate in 0.5 parts by weight of ethylene glycol was added.

The thus obtained reactants were transferred to a polymerization apparatus and the pressure was reduced while raising the temperature from 230° C. to 280° C. to perform a polycondensation reaction at a final achievement temperature of 280° C. and a degree of vacuum of 0.1 Torr. In this manner, a polyethylene terephthalate having an intrinsic viscosity of 0.58 and containing 12 eq/ton of COOH terminal groups was obtained.

After drying and crystallizing the thus obtained polyethylene terephthalate at 160° C. for 6 hours, the resultant was subjected to an 8 hour solid-phase polymerization at a temperature of 228° C. and a degree of vacuum of 0.3 Torr to obtain a polyethylene terephthalate having an intrinsic viscosity of 0.81 and containing 8.0 eq/ton of COOH terminal groups and 0.28 wt % of cyclic trimer. The thus obtained polyethylene terephthalate had a ratio Mn/Mw of 6.0, a number average molecular weight of 10,800 and a melting point (Tm) of 255° C. As described in the above, the alkaline earth metal species was magnesium and the amount thereof was 2.8 mol/ton. Further, the amount of elemental phosphorus was 3.6 mol/ton and that of OCP insoluble matter was 0.0 wt %.

Further, from an unstretched film prepared under the same conditions as in Example 1, a biaxially stretched film was obtained under the same drawing conditions as in Example 1. Tm−Th was 45° C. Since manganese was used in place of alkaline earth metal, the trend was that the electrostatic characteristics were slightly reduced and the thickness irregularities were slightly increased as compared to Example 1. However, comparing to Example 6, the thickness irregularities tended to be favorable. This is speculated to be because manganese, which is a transition metal, contributed to an improvement in the electrostatic characteristics, although the contribution is not as much as that provided by an alkaline earth metal. As shown in Table 5, the physical properties of the thus obtained biaxially stretched were about the same as those of Example 1 and they are at levels where the film can be used in a solar cell or the like with no problem.

Examples 14 to 24

A polyethylene terephthalate composition having a melting point (Tm) of 255° C. was obtained in the same manner as in Example 13 except that the amounts of the copolymer components were changed, and the thus obtained polyethylene terephthalate composition was made into an unstretched film. Using the thus obtained unstretched film, a biaxially stretched film was obtained in the same manner as in Example 1 except that the drawing conditions were changed as follows.

In Example 14, the thus obtained unstretched film was longitudinally stretched at a longitudinal drawing temperature of 90° C. and a longitudinal draw ratio of 3.8 times and then transversally stretched at a transversal drawing temperature of 110° C. and a transversal draw ratio of 3.8 times. The resulting stretched film was then heat-treated for 3 seconds at a heat treatment temperature (Th) of 220° C. to attain an effective area magnification rate of 13.2 times (Tm−Th was 35° C.). In Example 15, the thus obtained unstretched film was longitudinally stretched at a longitudinal drawing temperature of 90° C. and a longitudinal draw ratio of 3.8 times and then transversally stretched at a transversal drawing temperature of 110° C. and a transversal draw ratio of 3.8 times. The resulting stretched film was then heat-treated for 3 seconds at a heat treatment temperature (Th) of 200° C. to attain an effective area magnification rate of 13.2 times (Tm−Th was 55° C.). In Example 16, the thus obtained unstretched film was longitudinally stretched at a longitudinal drawing temperature of 87° C. and a longitudinal draw ratio of 3.8 times and then transversally stretched at a transversal drawing temperature of 100° C. and a transversal draw ratio of 3.8 times. The resulting stretched film was then heat-treated for 3 seconds at a heat treatment temperature (Th) of 200° C. to attain an effective area magnification rate of 13.2 times (Tm−Th was 55° C.).

In Example 17, the thus obtained unstretched film was longitudinally stretched at a longitudinal drawing temperature of 87° C. and a longitudinal draw ratio of 3.8 times and then transversally stretched at a transversal drawing temperature of 100° C. and a transversal draw ratio of 4.2 times. The resulting stretched film was then heat-treated for 3 seconds at a heat treatment temperature (Th) of 200° C. to attain an effective area magnification rate of 14.6 times (Tm−Th was 55° C.).

In Examples 18 to 20, the thus obtained unstretched film was longitudinally stretched at a longitudinal drawing temperature of 87° C. and a longitudinal draw ratio of 3.8 times and then transversally stretched at a transversal drawing temperature of 100° C. and a transversal draw ratio of 4.5 times. The resulting stretched film was then heat-treated for 3 seconds at a heat treatment temperature (Th) of 200° C. to attain an effective area magnification rate of 15.6 times (Tm−Th was 55° C.).

In Examples 21 to 23, the thus obtained unstretched film was longitudinally stretched at a longitudinal drawing temperature of 90° C. and a longitudinal draw ratio of 3.8 times and then transversally stretched at a transversal drawing temperature of 100° C. and a transversal draw ratio of 4.5 times. The resulting stretched film was then heat-treated for 3 seconds at a heat treatment temperature (Th) of 200° C. to attain an effective area magnification rate of 15.6 times (Tm−Th was 55° C.).

In Example 24, the thus obtained unstretched film was longitudinally stretched at a longitudinal drawing temperature of 90° C. and a longitudinal draw ratio of 3.8 times and then transversally stretched at a transversal drawing temperature of 100° C. and a transversal draw ratio of 3.8 times. The resulting stretched film was then heat-treated for 3 seconds at a heat treatment temperature (Th) of 200° C. to attain an effective area magnification rate of 13.2 times (Tm−Th was 55° C.).

In Example 14, since the heat treatment temperature (Th) was set at 220° C., which was 10° C. higher than that in Example 13, the retention of elongation after a 72 hour treatment at 125° C. and 100% RH tended to be decreased at 77%. However, this is at a level where the film can be used in a solar cell or the like with no problem. It is speculated that, because the heat treatment temperature Th was set high, the non-crystalline part was relaxed and embrittlement of the film thereby proceeded slightly.

In Example 15, since the heat treatment temperature (Th) was set at 200° C., which was 10° C. lower than that in Example 13, the retention of elongation after a 72 hour treatment at 125° C. and 100% RH and that after a 96 hour treatment at 125° C. and 100% RH both tended to be improved at 87% and 5.0%, respectively, which are sufficient for the film to be used in a solar cell. On the other hand, since the heat treatment temperature (Th) was set lower than that in Example 13, as compared to Example 13, the average heat shrinkage rate in the longitudinal and transverse directions during a 30-minute heat treatment at 150° C. tended to be somewhat large at 2% to 3%.

In Example 16, since the longitudinal drawing temperature (87° C.), transverse drawing temperature (100° C.) and heat treatment temperature (Th) (200° C.) were set lower than those in Example 13, the retention of elongation after a 72 hour treatment at 125° C. and 100% RH and that after a 96 hour treatment at 125° C. and 100% RH both tended to be improved at 88% and 7.0%, respectively, which are sufficient for the film to be used in a solar cell. Further, even comparing to Example 15, since the drawing temperatures were low, the planar orientation coefficient (fn) was increased to 0.165 and the retention of elongation after a 72 hour treatment at 125° C. and 100% RH and that after a 96 hour treatment both tended to be improved.

In Examples 17 and 18, since the transverse stretching of the film was performed at a draw ratio (transverse draw ratio of 4.2 times and 4.5 times, respectively) higher than that in Example 16 (transverse draw ratio of 3.8 times), the planar orientation coefficient (fn) was increased in proportion to the draw ratio to 0.168 and 0.171, respectively, and the retention of elongation after a 72 hour treatment at 125° C. and 100% RH (88% and 89%, respectively) and that after a 96 hour treatment (15% and 23%, respectively) both tended to be improved. These values are at sufficient levels for the films to be used in a solar cell.

In Example 19, the film formation and evaluations thereof were carried out under the same conditions as in Example 18 except that the polymer was supplied to the extruder in a dehumidified air atmosphere, so that the intrinsic viscosity (IV) of the unstretched film was reduced to 0.71 and the amount of COOH terminal groups in the unstretched film was increased to 13 mol/ton, and the retention of elongation after a 72 hour treatment at 125° C. and 100% RH (87%) and that after a 96 hour treatment (8.0%) both tended to be improved. These values are at sufficient levels for the film to be used in a solar cell. It is speculated that the intrinsic viscosity (IV) of the film was reduced and the amount of COOH terminal groups was increased because, as compared to Example 18, oxidative degradation was accelerated by the oxygen in the dehumidified air.

In Example 20, when the film formation was evaluated under the same conditions as in Example 19 except that the polymer filter was reinforced and the retention time was set to 20 minutes, comparing to Example 19, it was found that the intrinsic viscosity (IV) of the unstretched film was reduced to 0.68 and the amount of COOH terminal groups in the unstretched film was increased to 16 mol/ton; and that the retention of elongation after a 72 hour treatment at 125° C. and 100% RH (85%) and that after a 96 hour treatment (3.0%) both tended to be slightly decreased. Still, these values are at sufficient levels for the film to be used in a solar cell. It is speculated that the intrinsic viscosity (IV) of the film was reduced and the amount of COOH terminal groups was increased because, as compared to Example 18, thermal degradation was accelerated by the extended retention time.

In Example 21, the amount of trimellitic anhydride copolymer was changed to 0.07 mol % and the transverse draw ratio was set at 4.5 times, which was higher than that in Example 13. Also, the transverse drawing temperature and heat treatment temperature (Th) were set at 100° C. and 200° C. respectively, both of which were 10° C. lower than those in Example 13. Consequently, the planar orientation coefficient (fn) was increased to 0.171 and the retention of elongation after a 72 hour treatment at 125° C. and 100% RH (88%) and that after a 96 hour treatment (22%) both tended to be improved, and these values are at sufficient levels for the film to be used in a solar cell. Further, the reason why a comparable planar orientation coefficient was obtained despite that the longitudinal drawing temperature was higher than that in Example 18 is speculated to be because the amount of trimellitic anhydride copolymer was small, so that the film was easily oriented.

In Example 22, the amount of trimellitic anhydride copolymer was changed to 0.20 mol % and the transverse draw ratio was set at 4.5 times, which was higher than that in Example 13. Also, the heat treatment temperature (Th) was set at 100° C. and 200° C. respectively, both of which were 10° C. lower than that in Example 13. Consequently, as compared to Example 13, the planar orientation coefficient (fn) was increased to 0.170 and the retention of elongation after a 72 hour treatment at 125° C. and 100% RH (87%) and that after a 96 hour treatment (20%) both tended to be improved, and these values are at sufficient levels for the film to be used in a solar cell. Further, the reason why the planar orientation coefficient was lower than that of Example 21 is speculated to be because the amount of trimellitic anhydride copolymer was large, so that the film could not be easily oriented.

In Example 23, the amount of trimellitic anhydride copolymer was changed to 0.05 mol % and the transverse draw ratio was set at 4.5 times, which was higher than that in Example 13. Also, the transverse drawing temperature and heat treatment temperature (Th) were set at 100° C. and 200° C. respectively, both of which were 10° C. lower than those in Example 13. Consequently, the planar orientation coefficient (fn) was increased to 0.171 and the retention of elongation after a 72 hour treatment at 125° C. and 100% RH (87%) and that after a 96 hour treatment (10%) both tended to be improved, and these values are at sufficient levels for the film to be used in a solar cell. Meanwhile, comparing to Examples 21 and 22, both films had comparable planar orientation coefficients. However, the retention of elongation after a 72 hour treatment at 125° C. and 100% RH and that after a 96 hour treatment tended to be slightly decreased, and this is speculated to be attributable to the amount of trimellitic anhydride copolymer.

In Example 24, the amount of trimellitic anhydride copolymer was changed to 0.50 mol % but the transverse draw ratio was the same as that in Example 13 at 3.8 times. Also, the transverse drawing temperature and heat treatment temperature (Th) were set at 100° C. and 200° C. respectively, both of which were 10° C. lower than those in Example 13. Consequently, the planar orientation coefficient (fn) was increased to 0.168 and the retention of elongation after a 72 hour treatment at 125° C. and 100% RH (87%) tended to be improved as compared to Example 13, and these values are at sufficient levels for the film to be used in a solar cell. Meanwhile, comparing to Examples 21 and 22, the planar orientation coefficient (fn) was slightly decreased to 0.168 as described in the above and the retention of elongation after a 72 hour treatment at 125° C. and 100% RH (87%) and that after a 96 hour treatment (1.0%) also tended to be slightly decreased. This is speculated to be attributable to the amount of trimellitic anhydride copolymer.

In all of the above-described Examples, the respective films were at a level where they can be used in a solar cell or the like with no problem. However, in particular, the retention of elongation was higher in Examples 15 to 21 and even higher in Examples 18, 21 and 22.

Example 25

A polyethylene terephthalate having an intrinsic viscosity of 0.58 and containing 14 eq/ton of COOH terminal groups was obtained in the same manner as in Example 11 except that sodium dihydrogen phosphate dihydrate and trimellitic anhydride were not added.

After drying and crystallizing the thus obtained polyethylene terephthalate at 160° C. for 6 hours, the resultant was subjected to an 8 hour solid-phase polymerization at a temperature of 228° C. and a degree of vacuum of 0.3 Torr to obtain a polyethylene terephthalate for lamination, in which the intrinsic viscosity was 0.82 and the contents of COOH terminal groups and cyclic trimer were 10 eq/ton and 0.28 wt %, respectively. This polyethylene terephthalate had a ratio Mn/Mw of 3.2, a number average molecular weight of 10,800 and a melting point (Tm) of 255° C.

The thus obtained polyethylene terephthalate for lamination was vacuum-dried at a temperature of 180° C. for 3 hours and then supplied to a secondary extruder. Further, a polyester having an intrinsic viscosity of 0.80 and containing 8.0 eq/ton of terminal carboxyl groups (glass transition temperature: 83° C., melting point: 255° C.), which was obtained by performing polymerization in the same manner as in Example 13, was vacuum-dried for 3 hours and then supplied to a main extruder used separately from the secondary extruder. The polyethylene terephthalate for lamination and the polyester were each melted at 280° C. under a nitrogen atmosphere and then, they were joined such that the component layer supplied to the secondary extruder is laminated on both surfaces of the component layer supplied to the main extruder at a thickness ratio of component layer of secondary extruder:component layer of main extruder:component layer of secondary extruder=1:6:1. Thereafter, the resultant was melt-coextruded in the form of a three layer-laminate from the mouthpiece of a T-die to prepare a laminated sheet, which was then adhered, cooled and solidified by electro-pinning on a drum whose surface temperature was maintained at 20° C. to obtain an unoriented (unstretched) laminated film. The thus obtained laminated sheet was biaxially stretched and heat-treated under the same conditions as in Example 1 to obtain a laminated biaxially stretched film. Tm−Th was 45° C. The properties of the thus obtained film were evaluated and the results thereof are shown in Table 8. Since a layer not containing cross-linked component was laminated, as shown in Table 8, the retention of elongation after a 72 hour treatment at 125° C. and 100% RH tended to be slightly decreased at 75% as compared to Example 1 (86%). However, the physical properties of the thus obtained biaxially stretched films were at levels where the film can be used in a solar cell or the like with no problem.

Comparative Example 4

An unstretched film was prepared in the same manner as in Example 10 except that the amount of trimellitic anhydride copolymer and the melt-polymerization temperature were changed to 0.05 mol % and 290° C., respectively; that the ejection was performed at an intrinsic viscosity (IV) of 0.65 and the intrinsic viscosity (IV) after the solid-phase polymerization was 0.70; and that the ratio Mw/Mn was set at 4.5, and a biaxially stretched film was obtained from the thus prepared unstretched film under the same drawing conditions as in Example 10. Tm−Th was 45° C. As for the physical properties of the thus obtained biaxially stretched film, as shown in Table 4, the ratio Mw/Mn was out of our prescribed range so that the retention of elongation after a 72 hour treatment at 125° C. and 100% RH was 40%, which is not sufficient for the film to be used in a solar cell.

Example 26

A biaxially stretched film was obtained in the same manner as in Example 18 except that the amount of manganese acetate tetrahydrate and that of calcium acetate tetrahydrate were changed to 0.07 parts by weight and 0.5 parts by weight, respectively. Tm−Th was 55° C. The properties of the thus obtained film were evaluated and the results thereof are shown in Table 9. The amount of OCP insoluble matter tended to be increased as compared to Example 18 at 0.10 wt %. However, this is at a level where the film can be used in a solar cell with no problem. The cause of the increase in OCP insoluble matter is speculated to be that internally precipitated particles such as calcium terephthalate were formed by reaction of calcium acetate during the polymerization reaction.

TABLE 1

|  | Example 1 | Example 2 | Example 3 | Example 4 |
|---|---|---|---|---|
| Copolymer component | TMTM | TMA | BTA | glycerine |
| Amount of copolymerized component (mol %) | 0.50 | 0.50 | 0.03 | 0.90 |
| Alkali metal species | sodium | sodium | potassium | sodium |
| Alkali metal amount (mol/ton) | 1.7 | 1.7 | 2.8 | 1.7 |
| Alkaline earth metal species | magnesium | magnesium | calcium | magnesium |
| Alkaline earth metal amount (mol/ton) | 2.8 | 2.8 | 3.4 | 2.0 |
| Phosphorus compound | Phosphoric acid Sodium dihydrogen phosphate | Phosphoric acid Sodium dihydrogen phosphate | Phosphoric acid Potassium dihydrogen phosphate | Phosphoric acid Sodium dihydrogen phosphate |
| Elemental phosphorus amount (mol/ton) | 3.6 | 3.6 | 4.5 | 3.6 |
| Alkaline earth metal/Elemental phosphorus (molar ratio) | 0.77 | 0.77 | 0.92 | 0.55 |
| pH of phosphoric acid/alkali metal phosphate ethylene glycol solution | 5.0 | 5.0 | 6.0 | 5.0 |
| Number average molecular weigh (Mn) | 11,200 | 11,500 | 10,100 | 9,300 |
| Mw/Mn | 6.5 | 6.5 | 5.3 | 7.7 |
| COOH terminal groups amount of polymer (eq/ton) | 8.0 | 8.0 | 9.1 | 7.5 |
| OCP insoluble matter (wt %) | 0.0 | 0.0 | 0.0 | 0.3 |
| Cyclic trimer content (wt %) | 0.27 | 0.29 | 0.29 | 0.30 |
| ΔCOOH (eq/ton) | 23 | 23 | 27 | 25 |
| Effective area magnification rate (times) | 13.2 | 13.2 | 10.2 | 12.1 |
| Planar orientation coefficient (fn) | 0.164 | 0.164 | 0.160 | 0.161 |
| COOH terminal groups amount of unstretched film (eq/ton) | 10 | 10 | 11 | 9.7 |
| Intrinsic viscosity of unstretched film (IV) | 0.75 | 0.75 | 0.72 | 0.70 |
| Minimal endothermic peak temperature of P-layer Tmetap (° C.) | 198 | 198 | 198 | 198 |
| Tm-Tmetap (° C.) | 57 | 57 | 57 | 57 |
| Retention of elongation (%) After 72 hr treatment | 86 | 86 | 75 | 73 |
| Retention of elongation (%) After 96 hr treatment | 1.0 | 1.0 | 1.0 | 1.0 |

TMTM: Trimetyhyl trimellitate,
TMA: Trimellitic anhydride,
BTA: butanetetracarboxylic acid

TABLE 2

|  | Example 5 | Example 6 | Example 7 | Example 8 |
|---|---|---|---|---|
| Copolymer component | TMTM | TMTM | TMTM | BTA |
| Amount of copolymerized component (mol %) | 0.30 | 0.50 | 0.50 | 0.10 |
| Alkali metal species | sodium | sodium | sodium | sodium |
| Alkali metal amount (mol/ton) | 1.7 | 1.2 | 1.7 | 1.7 |
| Alkaline earth metal species | magnesium | — | magnesium | magnesium |
| Alkaline earth metal amount (mol/ton) | 2.8 | — | 2.8 | 2.8 |
| Phosphorus compound | Phosphoric acid Potassium dihydrogen phosphate | Phosphoric acid Sodium dihydrogen phosphate | Phosphoric acid Sodium dihydrogen phosphate | Phosphoric acid Sodium dihydrogen phosphate |
| Elemental phosphorus amount (mol/ton) | 3.6 | 3.1 | 3.6 | 3.6 |
| Alkaline earth metal/Elemental phosphorus (molar ratio) | 0.77 | — | 0.76 | 0.76 |
| pH of phosphoric acid/alkali metal phosphate ethylene glycol solution | 5.0 | 4.5 | 5.0 | 5.0 |
| Number average molecular weight (Mn) | 11,200 | 11,500 | 12,300 | 10,800 |
| Mw/Mn | 6.0 | 6.5 | 6.0 | 6.0 |
| COOH terminal groups amount of polymer (eq/ton) | 8.5 | 8.0 | 13 | 14 |
| OCP insoluble matter (wt %) | 0.0 | 0.0 | 0.1 | 0.3 |
| Cyclic trimer content (wt %) | 0.27 | 0.29 | 0.28 | 0.29 |
| ΔCOOH (eq/ton) | 24 | 35 | 32 | 30 |
| Effective area magnification rate (times) | 9.5 | 13.2 | 13.2 | 13.2 |
| Planar orientation coefficient (fn) | 0.159 | 0.164 | 0.164 | 0.164 |
| COOH terminal groups amount of unstretched film (eq/ton) | 11 | 9.8 | 16 | 16 |
| Intrinsic viscosity of unstretched film (IV) | 0.75 | 0.75 | 0.77 | 0.75 |

TABLE 2-continued

|  |  | Example 5 | Example 6 | Example 7 | Example 8 |
|---|---|---|---|---|---|
| Minimal endothermic peak temperature of P-layer Tmetap (° C.) | | 198 | 198 | 198 | 198 |
| Tm-Tmetap (° C.) | | 57 | 57 | 57 | 57 |
| Retention of elongation (%) | After 72 hr treatment | 73 | 78 | 82 | 83 |
| | After 96 hr treatment | 1.0 | 1.0 | 1.0 | 1.0 |

TMTM: Trimetyhyl trimellitate,
BTA: butanetetracarboxylic acid

TABLE 3

|  | Example 9 | Example 10 | Example 11 | Example 12 |
|---|---|---|---|---|
| Copolymer component | TMTM | TMA | TMTM | TMTM |
| Amount of copolymerized component (mol %) | 0.50 | 0.50 | 0.50 | 0.50 |
| Alkali metal species | sodium | sodium | sodium | sodium |
| Alkali metal amount (mol/ton) | 1.4 | 1.7 | 1.0 | 1.0 |
| Alkaline earth metal species | magnesium | magnesium | magnesium | magnesium |
| Alkaline earth metal amount (mol/ton) | 2.8 | 2.8 | 1.7 | 1.9 |
| Phosphorus compound | Phosphoric acid Sodium dihydrogen phosphate | Phosphoric acid Sodium dihydrogen phosphate | Phosphoric acid Sodium dihydrogen phosphate | Phosphoric acid Sodium dihydrogen phosphate |
| Elemental phosphorus amount (mol/ton) | 4.8 | 3.6 | 1.8 | 3.0 |
| Alkaline earth metal/Elemental phosphorus (molar ratio) | 0.58 | 0.77 | 0.94 | 0.63 |
| pH of phosphoric acid/alkali metal phosphate ethylene glycol solution | 3.0 | 5.0 | 6.0 | 5.5 |
| Number average molecular weight (Mn) | 10,700 | 11,100 | 12,200 | 11,000 |
| Mw/Mn | 6.0 | 6.5 | 6.5 | 6.5 |
| COOH terminal groups amount of polymer (eq/ton) | 15 | 16 | 9.3 | 8.8 |
| OCP insoluble matter (wt %) | 0.0 | 0.0 | 0.0 | 0.0 |
| Cyclic trimer content (wt %) | 0.28 | 0.27 | 0.28 | 0.28 |
| ΔCOOH (eq/ton) | 43 | 38 | 30 | 27 |
| Effective area magnification rate (times) | 13.2 | 13.2 | 13.2 | 13.2 |
| Planar orientation coefficient (fn) | 0.164 | 0.164 | 0.164 | 0.164 |
| COOH terminal groups amount of unstretched film (eq/ton) | 16 | 18 | 11 | 11 |
| Intrinsic viscosity of unstretched film (IV) | 0.75 | 0.75 | 0.76 | 0.75 |
| Minimal endothermic peak temperature of P-layer Tmetap (° C.) | 198 | 198 | 198 | 198 |
| Tm-Tmetap (° C.) | 57 | 57 | 57 | 57 |
| Retention of elongation (%) After 72 hr treatment | 71 | 73 | 78 | 81 |
| After 96 hr treatment | 1.0 | 1.0 | 1.0 | 1.0 |

TMTM: Trimetyhyl trimellitate,
TMA: Trimellitic anhydride

TABLE 4

|  | Comparative Example 1 | Comparative Example 2 | Comparative Example 3 | Comparative Example 4 |
|---|---|---|---|---|
| Copolymer component | — | TMTM | Pyromellitic acid | TMA |
| Amount of copolymerized component (mol %) | — | 0.50 | 1.2 | 0.05 |
| Alkali metal species | sodium | — | sodium | sodium |
| Alkali metal amount (mol/ton) | 1.7 | — | 1.7 | 1.7 |
| Alkaline earth metal species | magnesium | magnesium | magnesium | magnesium |
| Alkaline earth metal amount (mol/ton) | 2.8 | 2.8 | 2.8 | 2.8 |
| Phosphorus compound | Phosphoric acid Sodium dihydrogen phosphate | Trimethyl phosphate | Phosphoric acid Sodium dihydrogen phosphate | Phosphoric acid Sodium dihydrogen phosphate |

TABLE 4-continued

|  | Comparative Example 1 | Comparative Example 2 | Comparative Example 3 | Comparative Example 4 |
|---|---|---|---|---|
| Elemental phosphorus amount (mol/ton) | 3.6 | 1.1 | 3.6 | 3.6 |
| Alkaline earth metal/Elemental phosphorus (molar ratio) | 0.77 | — | 0.77 | 0.77 |
| pH of phosphoric acid/alkali metal phosphate ethylene glycol solution | 5.0 | 2.5 | 5.0 | 5.0 |
| Number average molecular weight (Mn) | 12,200 | 11,700 | gelation | 8,700 |
| Mw/Mn | 3.4 | 6.5 | — | 4.5 |
| COOH terminal groups amount of polymer (eq/ton) | 11 | 8.8 | — | 19 |
| OCP insoluble matter (wt %) | 0.0 | 0.0 | 68 | 0.0 |
| Cyclic trimer content (wt %) | 0.28 | 0.29 | — | 0.3 |
| ΔCOOH (eq/ton) | 34 | 46 | — | 38 |
| Effective area magnification rate (times) | 13.2 | 13.2 | — | 13.2 |
| Planar orientation coefficient (fn) | 0.164 | 0.161 | — | 0.164 |
| COOH terminal groups amount of unstretched film (eq/ton) | 14 | 12 | — | 22 |
| Intrinsic viscosity of unstretched film IV | 0.77 | 0.77 | — | 0.64 |
| Minimal endothermic peak temperature of P-layer Tmetap (° C.) | 198 | 198 | — | 198 |
| Tm-Tmetap (° C.) | 57 | 57 | — | 57 |
| Retention of elongation (%) After 72 hr treatment | 53 | 33 | — | 40 |
| Retention of elongation (%) After 96 hr treatment | 0.0 | 0.0 | — | 1.0 |

TMTM: Trimetyhyl trimellitate,
TMA: Trimellitic anhydride

TABLE 5

|  | Example 13 | Example 14 | Example 15 | Example 16 |
|---|---|---|---|---|
| Copolymer component | TMA | TMA | TMA | TMA |
| Amount of copolymerized component (mol %) | 0.10 | 0.10 | 0.10 | 0.10 |
| Alkali metal species | sodium | sodium | sodium | sodium |
| Alkali metal amount (mol/ton) | 1.7 | 1.7 | 1.7 | 1.7 |
| Manganese metal amount (mol/ton) | 2.8 | 2.8 | 2.8 | 2.8 |
| Phosphorus compound | Phosphoric acid Sodium dihydrogen phosphate | Phosphoric acid Sodium dihydrogen phosphate | Phosphoric acid Sodium dihydrogen phosphate | Phosphoric acid Sodium dihydrogen phosphate |
| Elemental phosphorus amount (mol/ton) | 3.6 | 3.6 | 3.6 | 3.6 |
| Manganese metal/Elemental phosphorus (molar ratio) | 0.77 | 0.77 | 0.77 | 0.77 |
| pH of phosphoric acid/alkali metal phosphate ethylene glycol solution | 5.0 | 5.0 | 5.0 | 5.0 |
| Number average molecular weight (Mn) | 10,800 | 10,800 | 10,800 | 10,800 |
| Mw/Mn | 6.0 | 6.0 | 6.0 | 6.0 |
| COOH terminal groups amount of polymer (eq/ton) | 8.0 | 8.0 | 8.0 | 8.0 |
| OCP insoluble matter (wt %) | 0.0 | 0.0 | 0.0 | 0.0 |
| Cyclic trimer content (wt %) | 0.28 | 0.28 | 0.28 | 0.28 |
| ΔCOOH (eq/ton) | 23 | 23 | 23 | 23 |
| Effective area magnification rate (times) | 13.2 | 13.2 | 13.2 | 13.2 |
| Planar orientation coefficient (fn) | 0.165 | 0.166 | 0.163 | 0.165 |
| COOH terminal groups amount of unstretched film (eq/ton) | 10 | 10 | 10 | 10 |
| Intrinsic viscosity of unstretched film (IV) | 0.73 | 0.73 | 0.73 | 0.73 |
| Minimal endothermic peak temperature of P-layer Tmetap (° C.) | 198 | 208 | 188 | 188 |
| Tm-Tmetap (° C.) | 57 | 47 | 67 | 67 |
| Retention of elongation (%) After 72 hr treatment | 86 | 77 | 87 | 88 |
| Retention of elongation (%) After 96 hr treatment | 1.0 | 1.0 | 5.0 | 7.0 |

TMA: Trimellitic anhydride

TABLE 6

|  |  | Example 17 | Example 18 | Example 19 | Example 20 |
|---|---|---|---|---|---|
| Copolymer component | | TMA | TMA | TMA | TMA |
| Amount of copolymerized component (mol %) | | 0.10 | 0.10 | 0.10 | 0.10 |
| Alkali metal species | | sodium | sodium | sodium | sodium |
| Alkali metal amount (mol/ton) | | 1.7 | 1.7 | 1.7 | 1.7 |
| Manganese metal amount (mol/ton) | | 2.8 | 2.8 | 2.8 | 2.8 |
| Phosphorus compound | | Phosphoric acid Sodium dihydrogen phosphate | Phosphoric acid Sodium dihydrogen phosphate | Phosphoric acid Sodium dihydrogen phosphate | Phosphoric acid Sodium dihydrogen phosphate |
| Elemental phosphorus amount (mol/ton) | | 3.6 | 3.6 | 3.6 | 3.6 |
| Manganese metal/Elemental phosphorus (molar ratio) | | 0.77 | 0.77 | 0.77 | 0.77 |
| pH of phosphoric acid/alkali metal phosphate ethylene glycol solution | | 5.0 | 5.0 | 5.0 | 5.0 |
| Number average molecular weight (Mn) | | 10,800 | 10,800 | 10,800 | 10,800 |
| Mw/Mn | | 6.0 | 6.0 | 6.0 | 6.0 |
| COOH terminal groups amount of polymer (eq/ton) | | 8.0 | 8.0 | 8.0 | 8.0 |
| OCP insoluble matter (wt %) | | 0.0 | 0.0 | 0.0 | 0.0 |
| Cyclic trimer content (wt %) | | 0.28 | 0.28 | 0.28 | 0.28 |
| ΔCOOH (eq/ton) | | 23 | 23 | 23 | 23 |
| Effective area magnification rate (times) | | 14.6 | 15.6 | 15.6 | 15.6 |
| Planar orientation coefficient (fn) | | 0.168 | 0.171 | 0.171 | 0.171 |
| COOH terminal groups amount of unstretched film (eq/ton) | | 10 | 10 | 13 | 16 |
| Intrinsic viscosity of unstretched film (IV) | | 0.73 | 0.73 | 0.71 | 0.68 |
| Minimal endothermic peak temperature of P-layer Tmetap (° C.) | | 188 | 188 | 188 | 188 |
| Tm-Tmetap(° C.) | | 67 | 67 | 67 | 67 |
| Retention of elongation (%) | After 72 hr treatment | 88 | 89 | 87 | 85 |
|  | After 96 hr treatment | 15 | 23 | 8.0 | 3.0 |

TMA: Trimellitic anhydride

TABLE 7

|  | Example 21 | Example 22 | Example 23 | Example 24 |
|---|---|---|---|---|
| Copolymer component | TMA | TMA | TMA | TMA |
| Amount of copolymerized component (mol %) | 0.07 | 0.20 | 0.05 | 0.50 |
| Alkali metal species | sodium | sodium | sodium | sodium |
| Alkali metal amount (mol/ton) | 1.7 | 1.7 | 1.7 | 1.7 |
| Manganese metal amount (mol/ton) | 2.8 | 2.8 | 2.8 | 2.8 |
| Phosphorus compound | Phosphoric acid Sodium dihydrogen phosphate | Phosphoric acid Sodium dihydrogen phosphate | Phosphoric acid Sodium dihydrogen phosphate | Phosphoric acid Sodium dihydrogen phosphate |
| Elemental phosphorus amount mol/ton) | 3.6 | 3.6 | 3.6 | 3.6 |
| Manganese metal/Elemental phosphorus (molar ratio) | 0.77 | 0.77 | 0.77 | 0.77 |
| pH of phosphoric acid/alkali metal phosphate ethylene glycol solution | 5.0 | 5.0 | 5.0 | 5.0 |
| Number average molecular weight (Mn) | 10,800 | 10,800 | 10,800 | 10,800 |
| Mw/Mn | 6.0 | 6.0 | 6.0 | 6.0 |
| COOH terminal groups amount of polymer (eq/ton) | 8.0 | 8.0 | 8.0 | 8.0 |
| OCP insoluble matter (wt %) | 0.0 | 0.0 | 0.0 | 0.0 |
| Cyclic trimer content (wt %) | 0.28 | 0.28 | 0.28 | 0.28 |
| ΔCOOH (eq/ton) | 23 | 23 | 23 | 23 |
| Effective area magnification rate (times) | 15.6 | 15.6 | 15.6 | 13.2 |
| Planar orientation coefficient (fn) | 0.171 | 0.170 | 0.171 | 0.168 |
| COOH terminal groups amount of unstretched film (eq/ton) | 10 | 10 | 10 | 10 |
| Intrinsic viscosity of unstreched film (IV) | 0.73 | 0.73 | 0.73 | 0.73 |
| Minimal endothermic peak temperature of P-layer Tmetap (° C.) | 188 | 188 | 188 | 188 |
| Tm-Tmetap(° C.) | 67 | 67 | 67 | 67 |

TABLE 7-continued

|  |  | Example 21 | Example 22 | Example 23 | Example 24 |
|---|---|---|---|---|---|
| Retention of elongation (%) | After 72 hr treatment | 88 | 87 | 87 | 87 |
|  | After 96 hr treatment | 22 | 20 | 10 | 1.0 |

TMA: Trimellitic anhydride

TABLE 8

|  | Example 25 | |
|---|---|---|
| Copolymer component | TMA | — |
| Amount of copolymerized component (mol %) | 0.10 | — |
| Alkali metal species | sodium | sodium |
| Alkali metal amount (mol/ton) | 1.7 | 1.7 |
| Manganese metal amount (mol/ton) | 2.8 | 2.8 |
| Phosphorus compound | Phosphoric acid Sodium dihydrogen phosphate | Phosphoric acid Sodium dihydrogen phosphate |
| Elemental phosphorus amount(mol/ton) | 3.6 | 3.6 |
| Manganese metal/Elemental phosphorus (molar ratio) | 0.77 | 0.77 |
| pH of phosphoric acid/alkali metal phosphate ethylene glycol solution | 5.0 | 5.0 |
| Number average molecular weight (Mn) | 10,800 | 10,800 |
| Mw/Mn | 6.0 | 3.2 |
| COOH terminal groups amount of polymer (eq/ton) | 8.0 | 10 |
| OCP insoluble matter (wt %) | 0.0 | 0.0 |
| Cyclic trimer content (wt %) | 0.28 | 0.28 |
| ΔCOOH (eq/ton) | 23 | — |
| Effective area magnification rate (times) | 13.2 | 13.2 |
| Planar orientation coefficient (fn) | 0.165 | — |
| COOH terminal groups amount of unstretched film (eq/ton) | 11 | — |
| Intrinsic viscosity of unstretched film IV | 0.73 | — |
| Minimal endothermic peak temperature of P-layer Tmetap (° C.) | 188 | — |
| Tm-Tmetap(° C.) | 67 | — |
| Retention of elongation (%) | After 72 hr treatment | 75 |
|  | After 96 hr treatment | 1.0 |

TMA: Trimellitic anhydride

TABLE 9

|  | Example 26 |
|---|---|
| Copolymer component | TMA |
| Amount of copolymerized component (mol %) | 0.10 |
| Alkali metal species | sodium |
| Alkali metal amount (mol/ton) | 1.7 |
| Alkaline earth metal species | calcium |
| Alkaline earth metal amount (mol/ton) | 2.8 |
| Phosphorus compound | Phosphoric acid Sodium dihydrogen phosphate |
| Elemental phosphorus amount mol/ton) | 3.6 |
| Alkaline earth metal/Elemental phosphorus (molar ratio) | 0.77 |
| pH of phosphoric acid/alkali metal phosphate ethylene glycol solution | 5.0 |
| Number average molecular weight (Mn) | 10,800 |
| Mw/Mn | 6.0 |
| COOH terminal groups amount of polymer (eq/ton) | 8.0 |
| OCP insoluble matter (wt %) | 0.10 |

TABLE 9-continued

|  | Example 26 |
|---|---|
| Cyclic trimer content (wt %) | 0.28 |
| ΔCOOH (eq/ton) | 23 |
| Effective area magnification rate (times) | 15.6 |
| Planar orientation coefficient (fn) | 0.171 |
| COOH terminal groups amount of unstretched film (eq/ton) | 10 |
| Intrinsic viscosity of unstretched film (IV) | 0.73 |
| Minimal endothermic peak temperature of P-layer Tmetap (° C.) | 188 |
| Tm-Tmetap (° C.) | 67 |
| Retention of elongation (%) | After 72 hr treatment | 89 |
|  | After 96 hr treatment | 24 |

TMA: Trimellitic anhydride

Industrial Applicability

By making the composition into a biaxially stretched film, a film which can be used in those applications of magnetic materials, electric materials such as condensers, packagings and the like and in particular, solar cell film applications where long-term hydrolysis resistance and excellent retention of elongation are required, can be provided.

The invention claimed is:

1. A polyethylene terephthalate composition comprising:
   a copolymer component having at least 3 functional groups in an amount of 0.01 mol % to 1.00 mol % with respect to ethylene terephthalate units, in which a ratio (Mw/Mn) between the weight average molecular weight and number average molecular weight of said polyethylene terephthalate composition is 5.0 to 8.0;
   an alkali metal compound in an amount of 1.0 mol/ton to 3.0 mol/ton in terms of alkali metal element;
   a phosphorus compound in an amount of 1.5 mol/ton to 5.0 mol/ton in terms of elemental phosphorus; and
   an o-chlorophenol insoluble matter in an amount of less than 0.5 wt %.

2. The polyethylene terephthalate composition according to claim 1, wherein the amount of COOH terminal groups is not greater than 15 eq/ton and a cyclic trimer content is not higher than 0.50 wt %.

3. The polyethylene terephthalate composition according to claim 1, wherein an increase in said amount of COOH terminal groups (ΔCOOH) is not greater than 40 eq/ton when said polyethylene terephthalate composition is treated in water vapor at 155° C. for 4 hours.

4. The polyethylene terephthalate composition according to claim 1, wherein the molar ratio of alkali metal element and elemental phosphorus is 0.5 to 1.5.

5. The polyethylene terephthalate composition according to claim 1, wherein said phosphorus compound is phosphoric acid and an alkali, metal phosphate.

6. A method of producing a polyethylene terephthalate composition of claimed 1, which comprises, when producing a polyethylene terephthalate composition using a terephthalic acid component, ethylene glycol and copolymer component having at least 3 functional groups through an esterification reaction or transesterification reaction, adding an ethylene glycol solution or slurry of a phosphoric acid and an alkali metal phosphate whose pH is adjusted to 2.0 to 6.0 at a time between substantial completion of said esterification reaction or transesterification reaction and the start of polycondensation reaction.

7. The method according to claim 6, which comprises, when producing a polyethylene terephthalate composition using terephthalic acid, ethylene glycol and a copolymer component having at least 3 functional groups through an esterification reaction, adding said ethylene glycol in an amount of 0.3 times by mole to 0.5 times by mole with respect to the total acid components in the period, between substantial completion of said esterification reaction and the start of polycondensation reaction.

8. A polyethylene terephthalate film comprising at least one polyethylene terephthalate film layer composed of the polyethylene terephthalate composition according to claim 1.

9. The polyethylene terephthalate film according to claim 8, wherein said polyethylene terephthalate film layer has a planar orientation coefficient of not lower than 0.150.

10. The polyethylene terephthalate film according to claim 8, wherein the amount of COOH terminal groups in said polyethylene terephthalate film layer is not greater than 20 eq/ton.

11. The polyethylene terephthalate film according to claim 8, wherein said polyethylene terephthalate film layer has an intrinsic viscosity (IV) of not lower than 0.65.

12. The polyethylene terephthalate film according to claim 8, whose retention of elongation after a 72 hour treatment at 125° C. and 100% RH is not lower than 70%.

13. A method of producing the polyethylene terephthalate film according to claim 8, which comprises biaxially stretching an unstretched film and then subjecting the thus stretched film, a heat treatment in a temperature range which satisfies Equation (1):

$$35° C. \leq Tm-Th \leq 90° C. \quad (1)$$

wherein, Tm: melting point (° C.) of said polyethylene terephthalate composition; and Th: heat treatment temperature (° C.).

14. A solar cell backsheet comprising the polyethylene terephthalate film according to claim 8.

15. The polyethylene terephthalate composition according to claim 2, wherein an increase in said amount of COOH terminal groups (ΔCOOH) is not greater than 40 eq/ton when said polyethylene terephthalate composition is treated in water vapor at 155° C. for 4 hours.

16. The polyethylene terephthalate film according to claim 9, wherein the amount of COOH terminal groups in said polyethylene terephthalate film layer is not greater than 20 eq/ton.

17. The polyethylene terephthalate composition according to claim 2, wherein the molar ratio of alkali metal element and elemental phosphorus is 0.5 to 1.5.

18. The polyethylene terephthalate composition according to claim 3, wherein the molar ratio of alkali metal element and elemental phosphorus is 0.5 to 1.5.

19. The polyethylene terephthalate composition according to claim 2, wherein said phosphorus compound is phosphoric acid and an alkali metal phosphate.

20. The polyethylene terephthalate composition according to claim 3, wherein said phosphorus compound is phosphoric acid and an alkali metal phosphate.

* * * * *